(12) United States Patent
Bedeschi et al.

(10) Patent No.: US 10,446,502 B2
(45) Date of Patent: Oct. 15, 2019

(54) APPARATUSES AND METHODS FOR SHIELDED MEMORY ARCHITECTURE

(71) Applicant: MICRON TECHNOLOGY, INC., Boise, ID (US)

(72) Inventors: Ferdinando Bedeschi, Biassono (IT); Umberto Di Vincenzo, Capriate san Gervasio (IT); Daniele Vimercati, El Dorado Hills, CA (US)

(73) Assignee: Micron, Technology, Inc., Boise, ID (US)

( * ) Notice: Subject to any disclaimer, the term of this patent is extended or adjusted under 35 U.S.C. 154(b) by 0 days.

(21) Appl. No.: 15/691,055

(22) Filed: Aug. 30, 2017

(65) Prior Publication Data

US 2019/0067206 A1 Feb. 28, 2019

(51) Int. Cl.
| | | |
|---|---|---|
| *H01L 23/552* | (2006.01) | |
| *H01L 23/528* | (2006.01) | |
| *H01L 27/108* | (2006.01) | |
| *H01L 27/11507* | (2017.01) | |
| *G11C 11/22* | (2006.01) | |
| *G11C 11/4091* | (2006.01) | |
| *G11C 11/409* | (2006.01) | |
| *G11C 11/16* | (2006.01) | |

(Continued)

(52) U.S. Cl.
CPC ........ *H01L 23/552* (2013.01); *G11C 11/1653* (2013.01); *G11C 11/1659* (2013.01); *G11C 11/221* (2013.01); *G11C 11/2253* (2013.01); *G11C 11/2255* (2013.01); *G11C 11/2257* (2013.01); *G11C 11/2259* (2013.01); *G11C 11/2273* (2013.01); *G11C 11/2275* (2013.01); *G11C 11/408* (2013.01); *G11C 11/409* (2013.01); *G11C 11/4085* (2013.01); *G11C 11/4091* (2013.01); *G11C 11/4094* (2013.01); *G11C 13/003* (2013.01); *G11C 13/0023* (2013.01); *H01L 23/528* (2013.01); *H01L 27/10805* (2013.01); *H01L 27/11507* (2013.01); *G11C 7/08* (2013.01); *G11C 7/1051* (2013.01); *G11C 7/1096* (2013.01); *G11C 2213/82* (2013.01)

(58) Field of Classification Search
USPC ............... 365/145, 65, 189.09, 200, 210.13; 257/E27.104, 295; 438/3
See application file for complete search history.

(56) References Cited

U.S. PATENT DOCUMENTS

| | | | | |
|---|---|---|---|---|
| 6,992,911 B2 * | 1/2006 | Takahashi | ............... | G11C 11/22 365/145 |
| 7,120,042 B2 * | 10/2006 | Takahashi | ............... | G11C 11/22 365/145 |

(Continued)

OTHER PUBLICATIONS

International Search Report and Written Opinion dated Dec. 13, 2018 for PCT Application No. PCT/US2018/047377, 13 pages.

*Primary Examiner* — Telly D Green
(74) *Attorney, Agent, or Firm* — Dorsey & Whitney LLP

(57) ABSTRACT

Apparatuses and methods for memory that includes a first memory cell including a storage component having a first end coupled to a plate line and a second end coupled to a digit line, and a second memory cell including a storage component having a first end coupled to a digit line and a second end coupled to a plate line, wherein the digit line of the second memory cell is adjacent to the plate line of the first memory cell.

20 Claims, 18 Drawing Sheets

(51) Int. Cl.
  *G11C 11/408* (2006.01)
  *G11C 11/4094* (2006.01)
  *G11C 13/00* (2006.01)
  *G11C 7/10* (2006.01)
  *G11C 7/08* (2006.01)

(56) References Cited

U.S. PATENT DOCUMENTS

| | | | |
|---|---|---|---|
| 9,721,638 B1* | 8/2017 | Kawamura | G11C 11/2275 |
| 9,881,661 B2* | 1/2018 | Guo | G11C 11/2273 |
| 2004/0090810 A1 | 5/2004 | Sakuma | |
| 2004/0090814 A1* | 5/2004 | Takahashi | G11C 11/22 365/145 |
| 2004/0190325 A1* | 9/2004 | Takahashi | G11C 11/22 365/145 |
| 2005/0047191 A1 | 3/2005 | Watanabe | |
| 2005/0122763 A1 | 6/2005 | Yamamura | |
| 2007/0133252 A1 | 6/2007 | Koide et al. | |
| 2010/0124093 A1 | 5/2010 | Shiga et al. | |
| 2017/0352397 A1* | 12/2017 | Guo | G11C 11/2273 |
| 2017/0358340 A1* | 12/2017 | Kawamura | G11C 11/2273 |
| 2017/0358370 A1* | 12/2017 | Mariani | G11C 29/50004 |
| 2017/0365318 A1* | 12/2017 | Ingalls | G11C 11/2275 |
| 2017/0365321 A1* | 12/2017 | Kawamura | G11C 11/2275 |
| 2017/0365322 A1* | 12/2017 | Kawamura | G11C 11/221 |
| 2017/0365323 A1* | 12/2017 | Calderoni | G11C 29/52 |
| 2017/0365360 A1* | 12/2017 | Fackenthal | G11C 29/50 |
| 2017/0372765 A1* | 12/2017 | Kawamura | G11C 11/2273 |
| 2018/0005680 A1* | 1/2018 | Kawamura | G11C 11/2275 |
| 2018/0005681 A1* | 1/2018 | Calderoni | G11C 11/2275 |
| 2018/0033467 A1* | 2/2018 | Villa | G11C 7/1021 |
| 2018/0059958 A1* | 3/2018 | Ryan | G06F 3/0611 |
| 2018/0061468 A1* | 3/2018 | Derner | G11C 11/221 |
| 2018/0061470 A1* | 3/2018 | Di Vincenzo | G11C 11/2273 |
| 2018/0068705 A1* | 3/2018 | Vimercati | G11C 11/2259 |
| 2018/0081774 A1* | 3/2018 | Kawamura | G11C 11/2275 |
| 2018/0114559 A1* | 4/2018 | Guo | G11C 11/221 |
| 2018/0122452 A1* | 5/2018 | Derner | G11C 11/2273 |
| 2018/0130513 A1* | 5/2018 | Kawamura | G11C 11/2259 |
| 2018/0137906 A1* | 5/2018 | Vimercati | G11C 7/1051 |

* cited by examiner

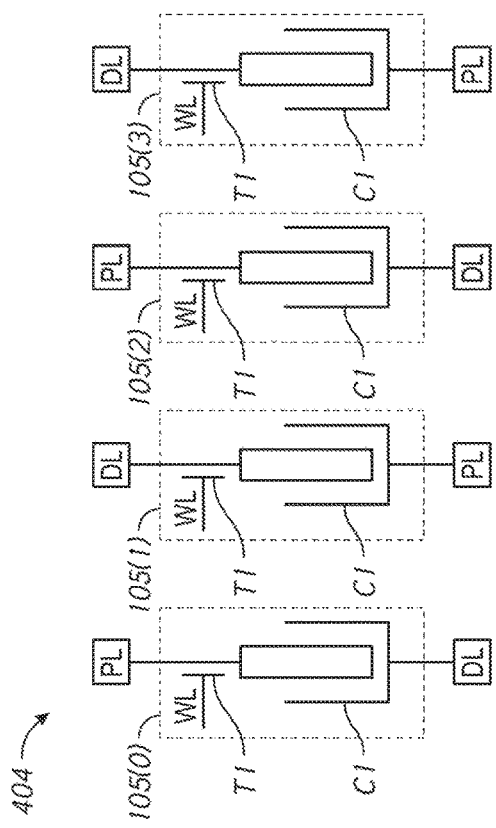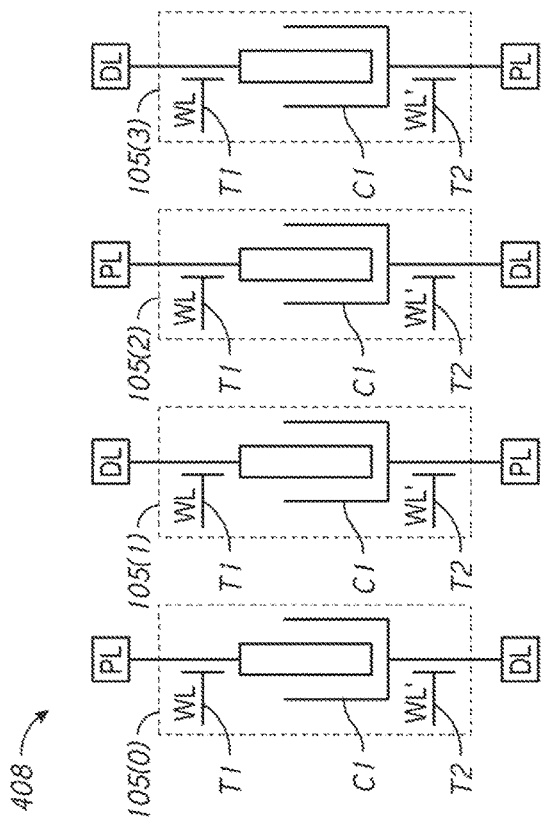

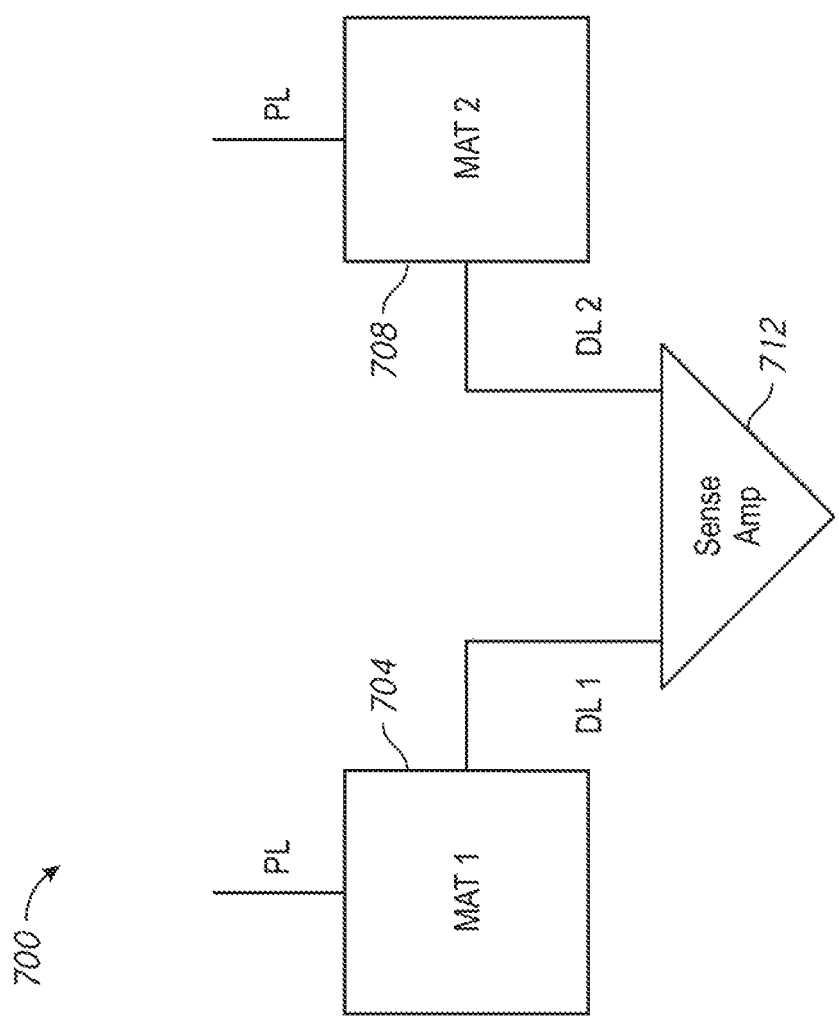

APPARATUSES AND METHODS FOR SHIELDED MEMORY ARCHITECTURE

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored information in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

Memory devices typically include voltage lines such as plate lines and sense lines that facilitate access to the cells of the memory device. A plate line generally provides a voltage to a storage component associated with a memory cell for example, a capacitor. The voltage on the plate line may be more or less constant during a memory access operation. A sense line is also coupled to the storage component and is generally configured to store a voltage that represents a logical value that is being read from or written to a memory cell. In contrast to the plate line, the voltage on the sense line generally varies during a memory access operation according to the data stored by the accessed memory cells.

A conventional memory array may produce electrical interference between the lines due to the changing voltages present in the sense lines. The interference may be referred to herein as "fringing" and may result in signal distortion and subsequent data errors. There is a need in the art to avoid this fringing effect and the related signal distortion and data errors.

BRIEF DESCRIPTION OF THE DRAWINGS

FIG. 4A and FIG. 4B are illustrations of more specific circuit implementations of the general circuit configuration of FIG. 3.

FIG. 7 is a block diagram of a memory according to an embodiment of the disclosure.

DETAILED DESCRIPTION

Figure 1:
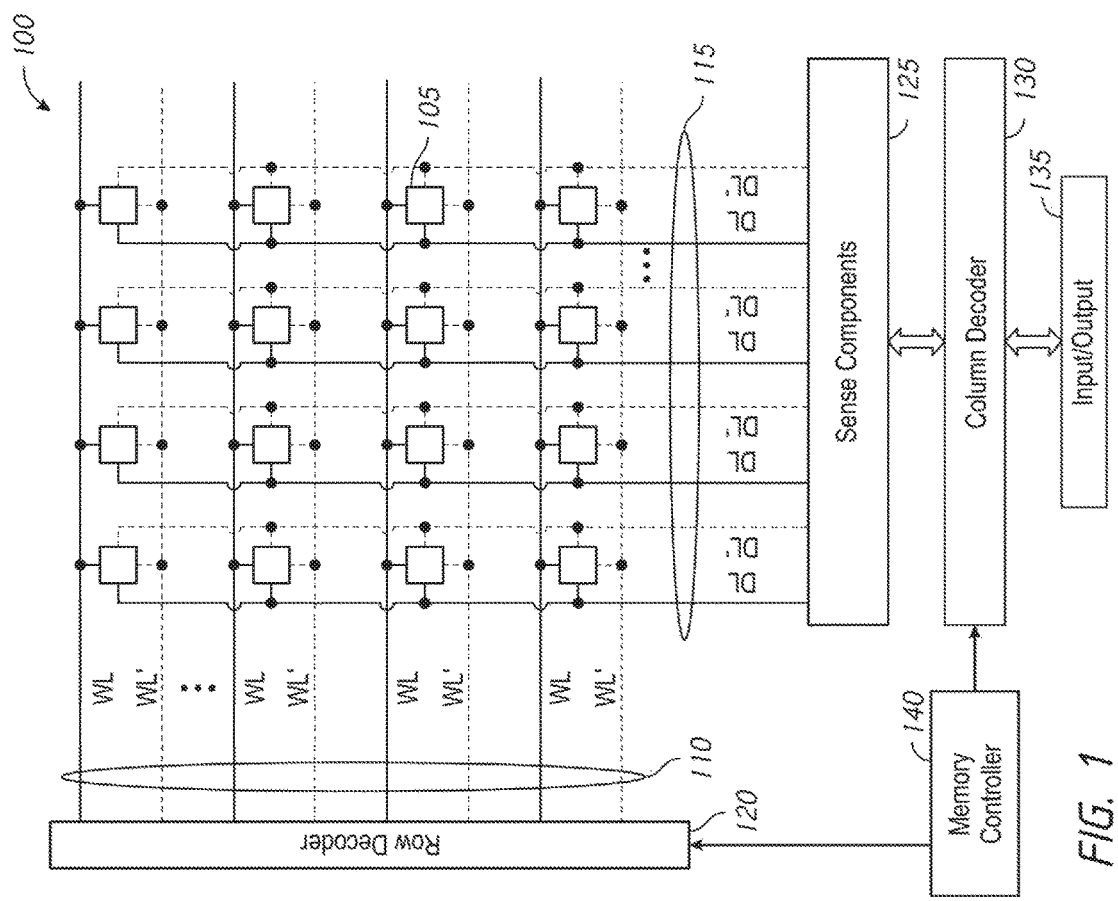
FIG. 1 is a block diagram of an example memory array in accordance with various embodiments of the present disclosure.

The present disclosure is generally directed to a memory architecture that includes an arrangement of signal lines that provides advantageous shielding between lines. An arrangement of signal lines disclosed herein generally includes an alternating pattern of plate and sense lines in a memory. As described in greater detail herein, a plate line generally provides a voltage to a storage component associated with a memory cell for example, a capacitor. The voltage on the plate line may be more or less constant during a memory access operation. A sense line is also coupled to the storage component and is generally configured to store a voltage that represents a logical value that is being read from or written to a memory cell. In contrast to the plate line, the voltage on the sense line generally varies during a memory access operation according to the data stored by the accessed memory cells.

An alternating pattern of plate and sense lines in accordance with embodiments of the disclosure generally avoids a conventional arrangement where sense lines are adjacent one another. An example of such a conventional arrangement includes adjacent memory cells that all have sense lines routed along the same side or area of the cells. Such adjacency of sense lines may lead to electrical interference between the lines due to the changing voltages present in the sense lines. This electrical interference results from the coupling between adjacent lines in close proximity. The interference may be referred to herein as "fringing" and may result in signal distortion and subsequent data errors. By alternating plate lines with sense lines, present embodiments route lines having more or less constant voltages (the plate lines) adjacent or otherwise nearby to lines carry data (the sense lines) that may be susceptible to fringing effects. The constant voltages of the plate lines provides shielding to the sense lines that reduces or avoids the undesirable fringing effects.

The present disclosure describes an alternating pattern of plate and signal lines in the context of different memory circuit configurations and topologies. Some embodiments are described with reference to "single-ended" memory cells that are configured to store one voltages to represent one logical value. Other embodiments are described with reference to "differential" memory cells that configured to store, two complementary voltages to represent one logical value. Some embodiments are described with reference to "planar" memory architectures where all the memory cells are more or less disposed in the same geometric plane. Other embodiments are described with reference to "three-dimensional" memory architectures where memory cells are arranged to different planes that stacked on top of one another.

Certain details are set forth below to provide a sufficient understanding of embodiments of the disclosure. However, it will be clear to one skilled in the art that embodiments of the disclosure may be practiced without these particular details. Moreover the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

FIG. 1 illustrates an example memory array 100 that supports a shielded memory architecture, in accordance with various embodiments of the present disclosure. Memory array 100 may also be referred to as an electronic memory apparatus. Memory array 100 includes memory, cells 105 that are programmable to store different states. Each state may represent different logic values. For example, for a memory storing two states, the logic values may be denoted as a logic 0 and a logic 1. In some cases, memory cell 105 is configured to store more than two logic values. A memory cell 105 may include a plurality of capacitors to store a charge representative of the programmable states. For example, charged and uncharged capacitors may represent two logic values, respectively.

Operations such as reading and writing may be performed on memory cells 105 by activating or selecting the appropriate access lines 110 and sense fines 115. Access lines 110 may also be referred to as word lines 110 and sense lines may also be referred to as digit lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, doped semiconductors, other conductive materials, or the like. According to the example of FIG. 1, each row of memory cells 105 is coupled to at least one word line 110, also referred to a word line WL. In some embodiments, the memory cells 105 are coupled to a second word line 100, also referred to as word line WL'. Each column of memory cells 105 is coupled to at least one digit line 115, also referred to as digit line DL. Each column of memory cells 105 may also be coupled to a second digit, line 115, also referred to as digit line DL'. By activating the respective word lines 110 and digit lines 115 (e.g., applying a voltage to the word lines 110 or digit lines 115), a memory cell 105 may be accessed at their intersection. Accessing the memory cell 105 may include reading or writing the memory cell 105. The intersection of a word lines 110 and digit lines 115 may be referred to as an address of a memory cell.

In some architectures, the logic storing device of a cell, e.g., capacitors, may be electrically isolated from the digit lines by selection components. A word line 110 may be coupled to and may control a selection component. For example, the selection components may be transistors and the word line(s) 110 may be coupled to the gates of the transistor(s). In some embodiments, a cell may include one transistor that is coupled to one word line WL. In other embodiments, a cell may include a first transistor coupled to a first word line WL and a second transistor coupled to a second word line WL'. Activating the word line 110 results in an electrical coupling or closed circuit between the capacitors of a memory cell 105 and corresponding digit line 115. The digit lines may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word lines 110 based on the received row address. Similarly, a column decoder 130 receives a column address from the memory controller 140 and activates the appropriate digit lines 115. For example, memory array 100 may include multiple word lines 110, and multiple digit lines 115. Thus, by activating word lines 110 and digit lines 115, the memory cell 105 at their intersection may be accessed.

Upon accessing, a memory cell 105 may be read, or sensed, by sense component 125 to determine the stored state of the memory cell 105. For example, after accessing the memory cell 105, the capacitors of memory cell 105 may discharge onto corresponding digit lines 115. Discharging the capacitors may be based on biasing, or applying a voltage, to the capacitors. In embodiments having one selection component (transistor), the discharging of cell capacitor(s) may cause a change in the voltage of the digit line DL, which voltage the sense component 125 may compare to a reference voltage (not shown) in order to determine the stored state of the memory cell 105. For example, if the digit line DL has a higher voltage than the reference voltage, then sense component 125 may determine that the stored state in memory cell 105 is a logic 1 and vice versa. In embodiments having two selection components (transistors), the discharging of cell capacitor(s) may cause a change in the voltages of the digit lines DL and DL', which voltages may then be compared to each other by the sense component 125 in order to determine the stored state of the memory cell 105. For example, if the first digit line DL has a higher voltage than the second digit line DL', then sense component 125 may determine that the stored state in memory cell 105 is a logic 1 and vice versa.

Sense component 125 may include various transistors or amplifiers in order to detect (e.g., compare) and amplify a difference in the signals, which may include latching the amplified difference. A separate sense component 125 may be provided for each first digit line DL. In embodiments having two selection components per memory cell, each first digit line DL is paired with a second DL' in the coupling to the separate sense component. The detected logic state, of memory cell 105 may then be output through column decoder 130 as output 135.

A memory cell 105 may be programmed, or written, by activating the relevant word lines 110 and digit lines 115. As discussed above, activating word lines 110 couples the corresponding row of memory cells 105 to their respective digit lines 115. By controlling the relevant digit lines 115 while the word lines 110 are activated, a memory cell 105 may be written—e.g., a logic value may be stored in the memory cell 105. Column decoder 130 may accept data, for example input 135, to be written to the memory cells 105. A memory cell 105 may be written by applying a voltage across the capacitor. This process is discussed in more detail below.

In some memory architectures accessing the memory cell 105 may degrade or destroy the stored logic state, and re-write (e.g., restore) operations may be performed to return the original logic state to memory cell 105. For example, the capacitors may be partially or completely discharged during a sense operation, corrupting the stored logic state. So the logic state may be re-written after a sense operation. Additionally, activating word lines 110 may result in the discharge of all memory cells in the row. Thus, several or all memory cells 105 in the row may need to be re-written.

The memory controller 140 may control the operation (e.g., read, write, restore, etc.) of memory cells 105 through the various components, such as row decoder 120, column decoder 130, and sense component 125. Memory controller 140 may generate row and column address signals in order to activate the desired word lines 110 and digit lines 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously. For example, multiple or all cells of memory array 100 may be accessed simultaneously during a reset operation in which all memory cells 105, or a group of memory cells 105, are set to a single logic state.

A memory cell 105 of the memory array may be either a ferroelectric memory cell or a dielectric memory cell. A ferroelectric memory cell may be configured as a non-volatile random-access memory (NVRAM) cell, which retains information when power is turned off. A dielectric memory cell may be configured as dynamic random-access memory cell (DRAM), which maintains data as long as power is applied. A ferroelectric memory cell, also referred to herein as an NVRAM memory cell, may include one or more capacitors that have a ferroelectric material disposed between opposing capacitor plates. Different levels of charge of a ferroelectric capacitor may represent different logic values. A dielectric memory cell, also referred to herein as a DRAM memory cell, may include one or more capacitors that have dielectric material disposed between opposing capacitor plates. Different levels of charge of a dielectric capacitor may represent different logic values. A ferroelectric memory cell may have beneficial properties that may result in improved performance relative to other memory architectures, for example, persistent storage of logic values without the need for periodic refresh operations. A dielectric memory cell may have beneficial properties that may result in improved performance relative to other memory architectures, for example, higher speed of memory access operations.

Figure 2A:
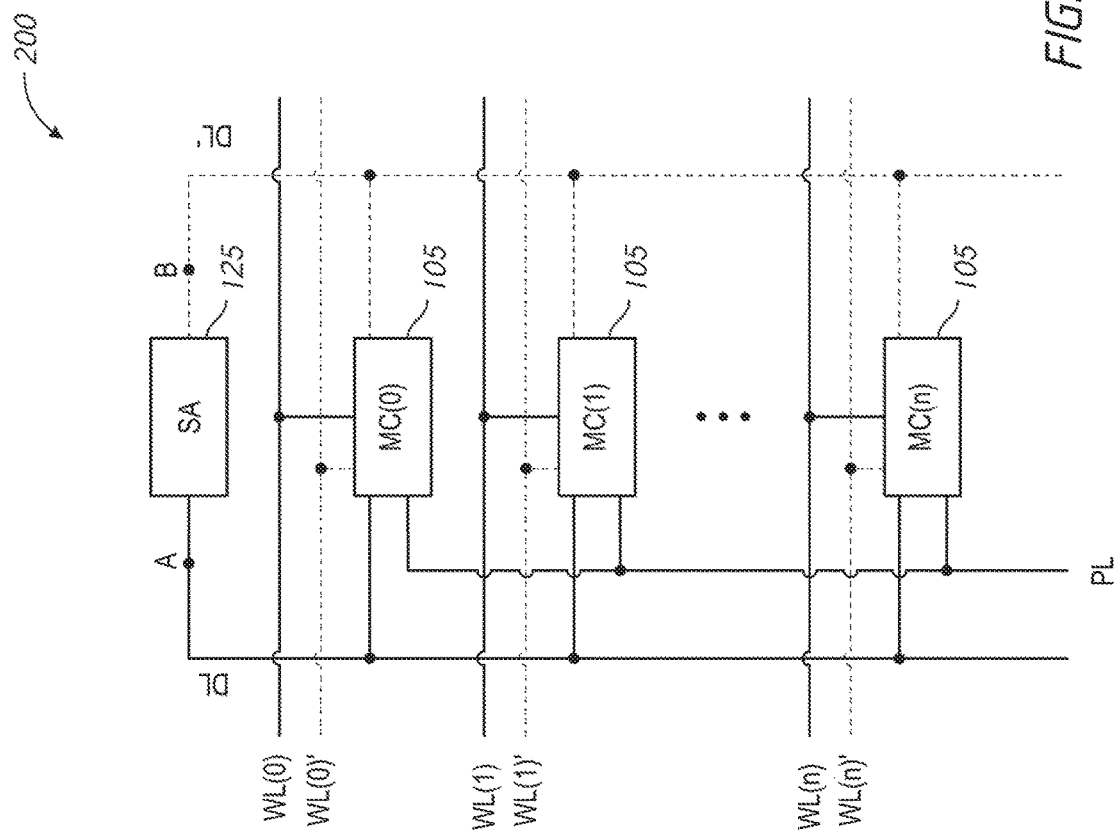
FIG. 2A is a schematic diagram of an example circuit that includes a column of memory cells according to an embodiment of the present disclosure.

FIG. 2A illustrates an example circuit 200 that includes a column of memory cells according to an embodiment of the present disclosure. FIG. 2A illustrates an example circuit 200 that includes memory cells 105 in accordance with various embodiments of the present disclosure. Circuit 200 includes memory cells 105 MC(0)-MC(n), where "n" depends on the array size. The circuit 200 further includes word lines WL(0)-WL(n), digit line DL, and sense component 125. The digit line DL is coupled to a sense node A of the sense component 125. In embodiments having one selection component per memory cell, a sense node B of the sense component may be coupled to a reference voltage. In embodiments having two selection components per memory cell, the circuit 200 may further include word lines WL(0)-WL(n) and digit line DL'. Here, the digit line DL' is coupled to the sense node B of the sense component 125. The word lines, digit lines, and sense component may be examples of memory cells 105, word lines 110, digit lines 115, and sense component 125, respectively, as described with reference to FIG. 1. While one column and n rows of memory cells 105 are shown in FIG. 2A, a memory array may include many columns and rows of memory cells as those shown.

Memory cells 105 may include a logic storage component, such as capacitors and selection components (not shown in FIG. 2A). In embodiments where the memory cells MC(0)-MC(n) are NVRAM memory cells, the capacitors of the memory cells 105 may be ferroelectric capacitors. In embodiments where the memory cells MC(0)-MC(n) are DRAM memory cells, the capacitors of the memory cells 105 may be dielectric capacitors. The capacitors may discharge upon coupling to digit lines DL and DL'. As previously described various states may be stored by charging or discharging the capacitors of the memory cell 105. The selection components of memory cell 105 may be activated by a respective word line. In embodiments having one selection component per memory cell, the memory cells MC(0)-MC(n) may be activated by a respective word line WL(0)-WL(n). In embodiments having two selection components per memory cell, the memory cells MC(0)-MC(n) may be activated by a respective word lines WL(0)-WL(n) and WL'(0)-WL'(n).

The memory cells MC(0)-MC(n) may be coupled to a plate line PL that may be used during access of the memory cells. In some embodiments, the plate line PL is tied to a constant voltage, while in other embodiments the plate line PL is coupled to a voltage driver that drives the plate line PL with different voltages. The plate line PL may be tied to a constant voltage when the memory cells MC(0)-MC(n) are implemented as DRAM memory cells. The plate line PL may be coupled to voltage driver that drives the plate line PL with different voltages when the memory cells MC(0)-MC(n) are implemented as NVRAM memory cells.

The stored state of a memory cell 105 may be read or sensed by operating various elements represented in circuit 200. Memory cell 105 may, be in electronic communication with digit line DL (or with digit, lines DL and DL'). For example, as will be, described in more detail below, capacitors of the memory cell 105 can be isolated from digit line DL (or from digit lines DL and DL') when selection components of the memory cell 105 are deactivated, and the capacitors can be coupled to digit line DL (or to digit lines DL and DL') when selection components are activated. Activating selection components of the memory cells 105 may be referred to as selecting memory cell 105. In some cases, selection components are transistors and the operation is controlled by applying voltages to the transistor gates, where the voltage magnitude is greater than the threshold voltage of the transistors. Word line WL (or word lines WL and WL') may activate the selection component(s). For example, a voltage applied to word line WL or WL' is applied to the transistor gate of a selection component of the memory cell 105. As a result, the capacitors of the selected memory cell 105 are coupled to digit line DL (or digit lines DL and DL') and DL', respectively.

Word lines WL(0)-WL(n) (or word lines WL(0)-WL(n) and WL'(0) and WL'(n)) are in electronic communication with selection components of memory cells 105 MC(0)-MC(n), respectively. Thus, activating the word line WL (or the word lines WL and WL') of a respective memory cell 105 MC may activate the memory cell 105 MC. For example, activating WL(0) activates memory cell MC(0), activating WL(1) activates memory cell MC(1), and so on.

To sense the logic value stored by a memory cell 105, the word line WL (or word lines WL and WL') may be biased to activate a respective memory cell 105, and a voltage may be applied to the digit line DL (or digit lines DL and DL') to change a voltage of the digit line DL (or digit lines DL and DL'). Activation of the memory cell 105 may cause a voltage change of the digit, line DL (or digit lines DL and DL') that is based on charge stored on the capacitors of the memory cell 105. The change in the voltage of the digit line DL (or digit lines DL and DL') may cause a change on sense nodes A and B of the sense component 25, respectively. The resulting voltage of digit lines DL and DL' may be compared to one another by the sense component 125 in order to determine the logic value represented by the stored state of each memory cell 105.

With regards to an NVRAM memory cell, biasing the plate line PL of an activated memory cell 105 may result in a voltage difference across the capacitors of the activated memory cell 105, which may yield a change in the stored charge on the capacitors. The magnitude of the change in stored charge may depend on the initial state of each capacitor—e.g., whether the initial state stored corresponded to a logic 1 or a logic 0. When the selection components of the memory cells 105 are activated by the word line WL (or by the word lines WL and WL'), the change in stored charge due to biasing the plate line PL may cause a change in the voltage of digit line DL (or in the voltages of the digit lines DL and DL') based on the charge stored on the capacitors of the activated memory cell 105. With regards to a DRAM memory cell, activating the memory cell 105 may cause charge stored on the capacitors to change the voltage of the digit lines DL (or the voltages of the digit lines DL and DL'). As previously described, the resulting voltage of the digit line DL (of the voltages of the digit lines DL and DL') may be used to determine the logic value of the stored state of the memory cell 105.

Sense component 125 may include various transistors or amplifiers to detect and amplify a difference in signals, which may including latching the amplified difference. Sense component 125 may include a sense amplifier that receives and compares the voltage of its sense nodes (e.g., sense nodes A and B). In embodiments having one selection component per memory cell, the voltage of the sense node A may be affected by the voltage of the first digit line DL, while the voltage of the sense node B may be affected by a reference voltage. In embodiments having two selection components per memory cell, the voltages of the sense nodes A and B may be affected by the voltages of the digit lines DL and DL', respectively. The sense amplifier output (e.g., sense node A) may be driven to a higher (e.g., a positive) or lower (e.g., negative or ground) supply voltage based on the comparison. The other sense node (e.g., sense node B) may be driven to a complementary voltage (e.g., the positive supply voltage is complementary to the negative or ground voltage, and the negative or ground voltage is complementary to the positive supply voltage). For instance, if the sense node A has a higher voltage than sense node B, then the sense amplifier may drive the sense node A to a positive supply voltage and drive the sense node B to a negative or ground voltage. Sense component 125 may latch the state of the sense amplifier (e.g., voltages of sense node A and/or sense node B and/or the voltages of digit lines DL and DL'), which may be used to determine the stored state and logic value of memory cell 105, e.g., logic 1. Alternatively, if the sense node A has a lower voltage than sense node B, the sense amplifier may drive the sense node A to a negative or ground voltage and drive the sense node B to a positive supply voltage. Sense component 125 may also latch the sense amplifier state for determining the stored state and the logic value of memory cell 105 logic 0.

The stored state may represent a logic value of memory cell 105, which may then be output, for example, through column decoder 130 as output 135 with reference to FIG. 1. In embodiments where the sense component 125 also drives the digit lines DL and DL' to complementary voltages, the complementary voltages may be applied to the memory cell 105 to restore the original data state read. By restoring the data, a separate restore operation is unnecessary.

A particular memory cell 106 may be implemented with various combinations of transistors (T) and capacitors (C). Any appropriate configuration may be used in accordance with the present disclosure. For example, a particular memory cell 105 may be implemented with configurations such as 1T1C, 2T1C, 2T2C, 3T2C, 4T2C, and so on.

Figure 2B:
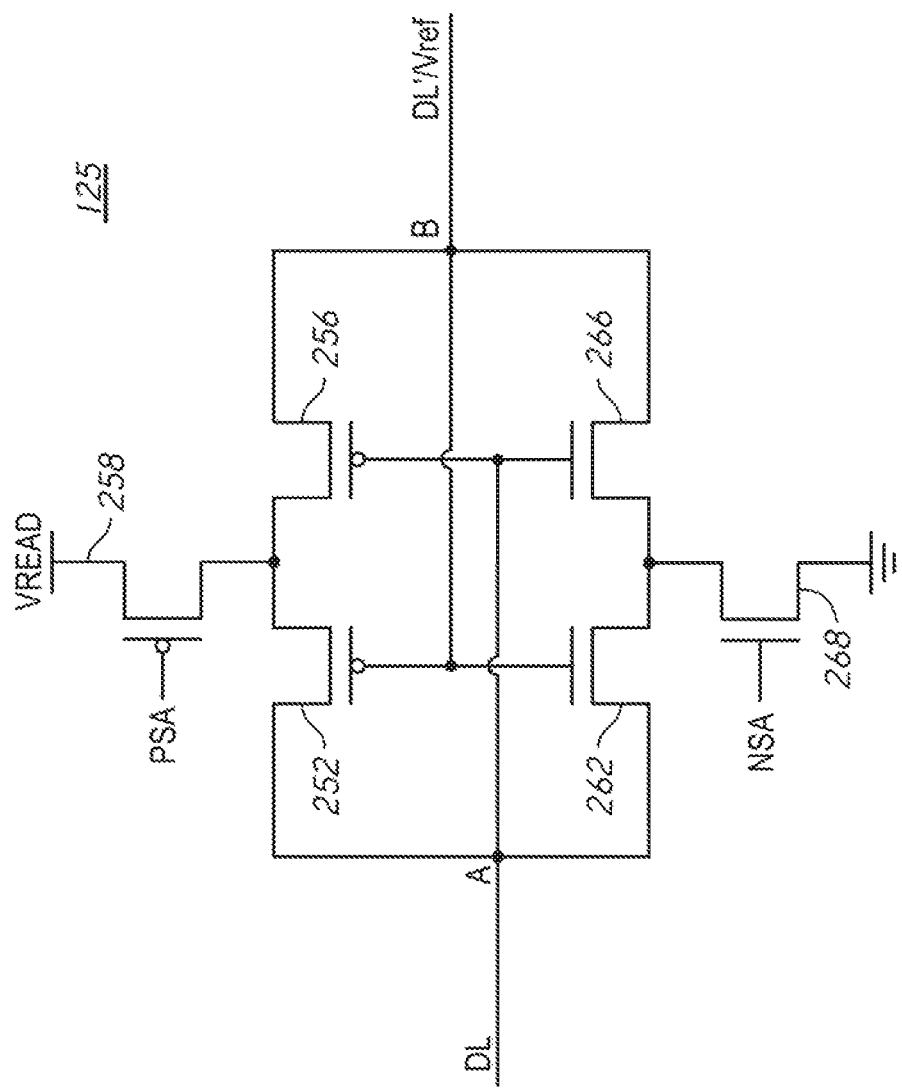
FIG. 2B is a schematic diagram of a sense component according to an embodiment of the disclosure.

FIG. 2B illustrates a sense component 125 according to an embodiment of the disclosure. The sense component 125 includes p-type field effect transistors 252 and 256 and n-type field effect transistors 262 and 266. Gates of the transistor 252 and transistor 262 are coupled to sense node A. Gates of the transistor 256 and transistor 266 are coupled to sense node B. The transistors 252 and 256, and the transistors 262 and 266 represent a sense amplifier. A p-type field effect transistor 258 is configured to be coupled to a power supply (e.g., VREAD voltage power supply) and is coupled to a common node of the transistors 252 and 256. The transistor 258 is activated by an active PSA signal (e.g., active low logic). An n-type field effect transistor 268 is configured to be coupled to a sense amplifier reference voltage (e.g., ground) and is coupled to a common node of the transistors 262 and 266. The transistor 268 is activated by an active NSA signal (e.g., active high logic).

In operation, the sense amplifier is activated by activating the PSA and NSA signals to couple the sense amplifier to the voltage of the power supply and the sense amplifier reference voltage. When activated, the sense amplifier compares the voltages of sense nodes A and B, and amplifies a voltage difference by driving the sense nodes A and B to complementary voltage levels (e.g., driving sense node A to VREAD and sense node B to ground, or driving sense node A to ground and sense node B to VREAD). When the sense nodes A and B have been driven to the complementary voltage levels, the voltages of sense nodes A and B are latched by the sense amplifier and remain latched until the sense amplifier is deactivated.

With reference to FIG. 2A, to write memory cell 105, a voltage may be applied across the capacitors of the memory cell 105. Various methods may be used. In some examples, selection components may be activated through word line WL (or word lines WL and WL'), respectively, in order to couple the capacitors to digit line DL (or digit lines DL and DL'). For example, a voltage may be applied across capacitors of the memory cell 105 by controlling the voltage of digit lines DL and DL' to apply a positive or negative voltage across the capacitors. In some embodiments, a complementary voltage is applied to the capacitors of the memory cell 105 to write the memory cell 105, for example, using the digit lines DL and DL', and plate line CP. As a non-limiting example, in some embodiments, to write a first logic value to the memory cell 105 a first voltage is applied to one plate of the capacitors and a second voltage complementary to the first voltage is applied to the other plate of the capacitors, and to write a second logic value to the memory cell 105 the second voltage is applied to the one plate of the capacitors and the first voltage is applied to the other plate of the capacitors.

In some examples, a restore operation may be performed after sensing. As previously discussed, the sense operation may degrade or destroy the originally stored state of the memory cell 105. After sensing the state may be written back to the memory cell 105. For example, sense component 25 may determine the stored state of memory cell 105 and may then write the same state back, for example, through the digit line DL (or digit lines DL and DL').

As mentioned, a particular memory cell 105 may be implemented with various combinations of transistors (T) and capacitors (C) and any appropriate configuration may be used in accordance with the present disclosure. For example, a particular memory cell 105 may be implemented with configurations such as 1T1C, 2T1C, 2T2C, 3T2C, 4T2C, and so on. Furthermore, different memory cells may be stacked or paired with each other in, any combination or configurations and cell types. In order to more particularly describe the operation of memory cells 105 in accordance with embodiments of the present disclosure, the following discussion references 2T2C and 1T1C memory cells by way of example and not limitation. It should be appreciated that the operations discussed below are specific examples of concepts that may be applied more generally to any memory cell configuration used to implement a memory cell 105 embodiment.

Figure 3:
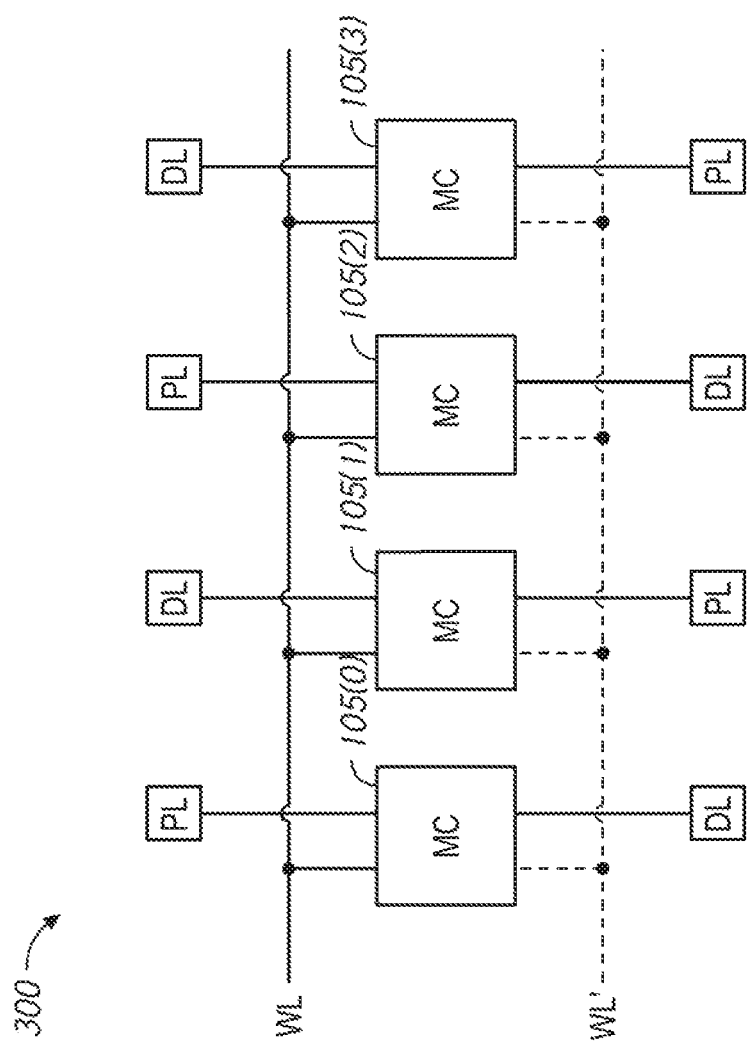
FIG. 3 is a schematic diagram of a general circuit configuration for an example circuit that includes a single row of memory cells according to an embodiment of the disclosure.

FIG. 3 is a schematic diagram of a general circuit configuration for an example circuit 300 that includes a single row of memory cells 105 according to an embodiment of the disclosure. The example circuit 300 of FIG. 3 includes single-ended memory cells. Here, the example circuit 300 stores a single logical value as a single voltage stored in one memory cell 105. The memory cells 105 are each coupled to at least one word line WL that may be coupled to and may control selection components associated with memory cells 105. By way of example and not limitation, FIG. 3 illustrates a portion of a single row of memory cells that includes four memory cells 105(0) through 105(3).

In some embodiments, the memory cells 105 may be also be coupled to a second word line WL' that, may be coupled to and may control selection components associated with the memory cells 105. The selection components may be transistors and the word line(s) may be coupled, to the gates of the transistor(s). In some embodiments, a memory cell 105 may include one transistor that is coupled to one word line WL. In other embodiments, a memory cell 105 may include a first transistor coupled to a first word line WL and a second transistor coupled to a second transistor WL'.

Each memory cell 105 may be coupled to one digit line DL. Although not, specifically illustrated in FIG. 3, a particular memory cell 105 may be a member of a column of memory cells 105 where each member of the column is coupled to the same digit line DL. Each memory cell 105 may be additionally coupled to a plate line PL that is used during access of the memory cell 105. Although not specifically illustrated in FIG. 3, a particular memory cell 105 may be a member of column of memory cells 105 where each member of the column is coupled to the same plate line L.

The example circuit 300 of FIG. 3 includes an alternating pattern of plate lines PL and digit lines DL in accordance with embodiments of the present disclosure. More specifically, the plate lines PL and digit line DL of circuit 300 are arranged such that a given digit line DL is adjacent to a plate line PL and not another digit line DL. For example, the digit line DL associated with the third memory cell 105(2) is adjacent to two plate lines PL and not adjacent to any other digit lines. The plate line PL associated with the second, memory cell 106(1) is located to the left of the digit line DL associated with the third memory cell 105(2). The plate line PL associated with the fourth memory cell 105(3) is located to the right of the digit line DL associated with the third memory cell 105(2). By alternating plate lines with digit lines, example circuit 300 of FIG. 3 (and those of FIG. 4A and FIG. 4B) route lines having more or less constant voltages (the plate lines) adjacent or otherwise nearby to lines carry data (the digit lines) that may be susceptible to fringing effects. The constant voltages of the plate lines provides shielding to the digit lines that reduces or avoids the undesirable fringing effects.

FIG. 4A and FIG. 4B are illustrations are more specific circuit implementations 404, 408 of the general circuit configuration of FIG. 3. A dashed line demarcates an approximate boundary of the memory cells 105. In the implementation of FIG. 4A, each of the memory cells 105 includes one selection component T1 and one capacitor C1 (e.g., 1T1C). In the implementation of FIG. 4B, each of the memory cells 105 includes two selection components T1 and T2 and one capacitor C1 (e.g., 2T1C). The capacitors C1 of each memory cell 105 may be ferroelectric capacitors or dielectric capacitors, depending on the implementation. The selection components T1 of a memory cell 105 may be transistors, for example, n-type field effect transistors. If present, the selection components T2 of a memory cell 105 may be transistors, for example, p-type field effect transistors.

Operation of the selection component T1 (or selection components T1 and T2) is controlled by applying voltages to the transistor gates. A respective word line may activate the selection components. Word line WL may activate the selection component T1 of a memory cell 105. If present, the word line WL' may activate the selection component T2 of a memory cell 105.

The capacitor C1 has a first plate and a second plate. The first and second plates of the capacitors C1 for each memory cell 105 may be coupled to plate lines PL and digit lines DL in an alternating fashion. Configuration and operation of the capacitors C1 for, the first and second memory cells 105(0) and 105(1) are described below by way of example and not limitation.

In the first memory cell 105(0), the first plate of capacitor C1 is coupled to a plate line PL through the T1 selection component. Additionally, the second plate of the capacitor C1 is coupled to a digit line DL. If the word line WL' is present, the second plate of the capacitor C1 is coupled to the digit line DL through the T2 selection component. If not, the second plate of the capacitor C1 may be directly coupled to the digit line DL.

In the second memory cell 105(1), the first plate of capacitor C1 is coupled to a digit line DL through the T1 selection component. Additionally, the second plate of capacitor C1 is coupled to a plate line PL. If the word line WL' is present, the second plate of the capacitor C1 is coupled to the plate line PL through the T2 selection component. If not, the second plate of the capacitor C1 may be directly coupled to the plate line PL.

When the first memory cell 105(0) is activated, such as by word line (or by WL and WL'), the second plate of capacitor C1 is coupled to a digit line DL. When the second memory cell 105(1) is activated, such as by word line WL (or by WL and WL'), the first plate of capacitor C1 is coupled to a digit line DL.

As previously discussed, when coupled to a digit line DL, a memory cell 105 may be accessed. For example, a stored state of the memory cells 105 may be read and/or the memory cells 105 may be written to store a new state or the same state. Various voltages, for example, may be applied to the plates of the capacitor C1 over the digit lines DL and the plate line PL to access (e.g., read and/or write) the memory cells 105. In DRAM embodiments, the plate line PL may be tied to a constant voltage. In NVRAM embodiments, the plate line PL may be coupled to a voltage driver that drives the plate line PL, with different voltages. The plate line PL may be driven with different voltages during different phases of an NVRAM write operation.

Figure 4C:
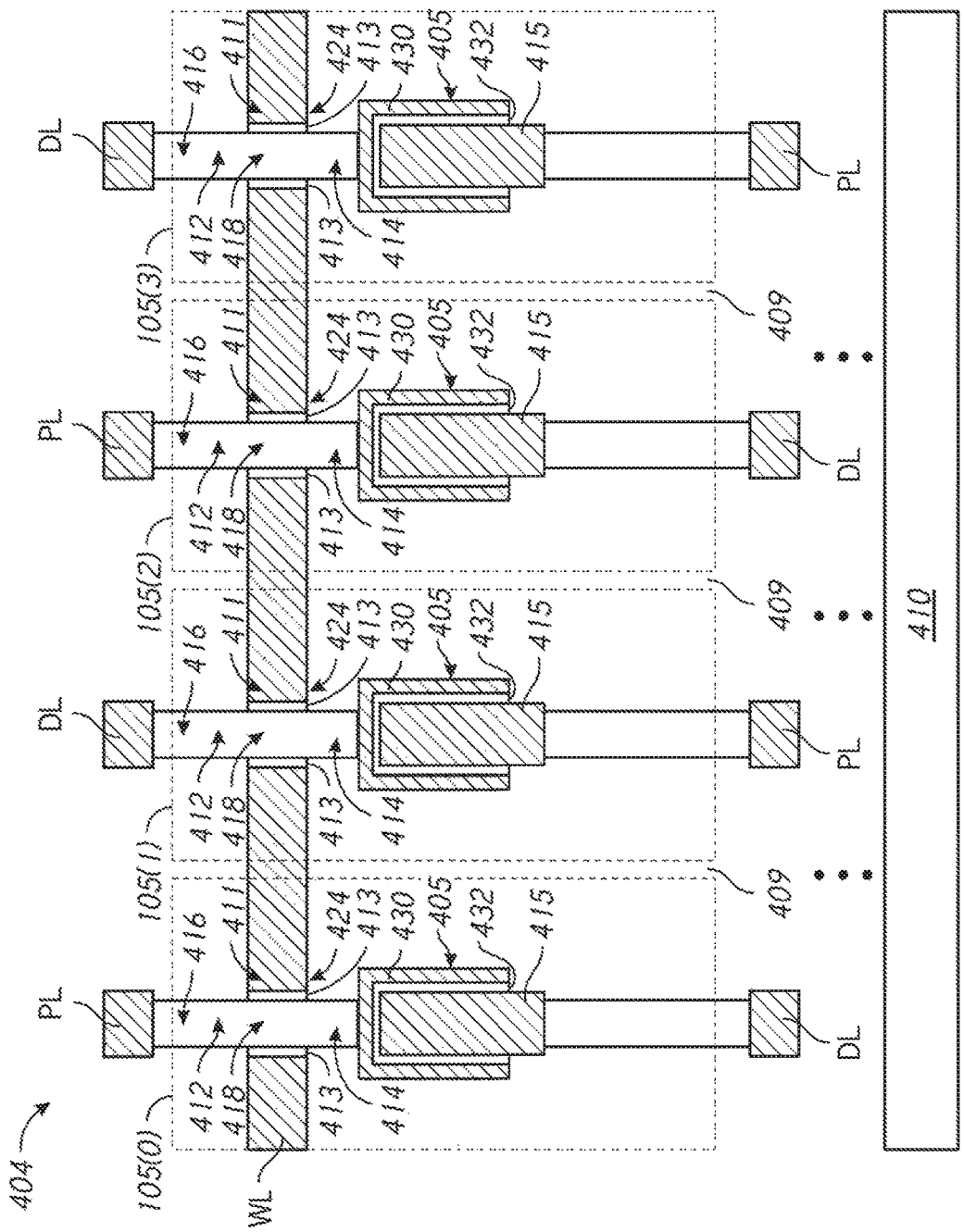
FIG. 4C and FIG. 4D are diagrams depicting a cross-sectional side view of a portion of a memory array showing memory cells according to an embodiment of the disclosure.
Figure 4D:
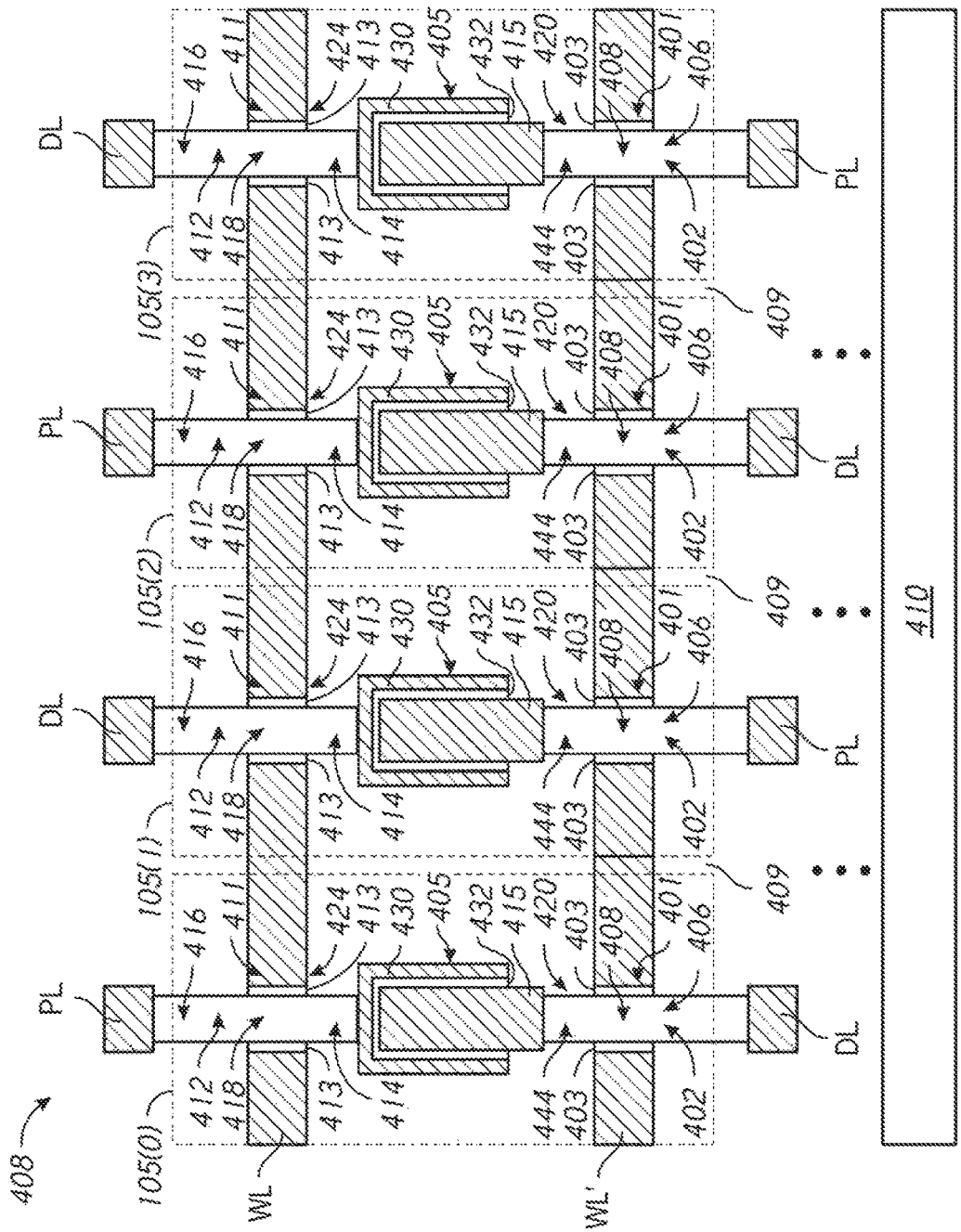

FIG. 4C and FIG. 4D are layout diagrams for the circuit implementations in accordance with embodiments of the present disclosure. FIG. 4C includes a layout diagram for the circuit implementation 404 of FIG. 4A. FIG. 4D includes a layout diagram for the circuit implementation 408 of FIG. 4D. FIG. 4C and FIG. 4D illustrate a portion of a memory array 100 including an example embodiment of memory cells 105 according to the disclosure.

The illustrated region of memory array 100 includes digit lines DL and plate lines PL. The digit lines DL and plate lines PL are vertically offset relative to one another. The digit lines DL and plate lines PL are arranged in an alternating pattern such that a given digit line DL is adjacent to a plate line PL and not another digit line DL. The digit lines DL may be connected to a sense component (as shown in FIG. 1). Four adjacent memory cells 105(0)-106(3) are shown, with such adjacent memory cells being in a common row as one another within the memory array (e.g., being along a common row represented by word line WL and/or word line WL'). Insulative material 409 is shown to surround the various components of memory cells 105. In some embodiments, alternating memory cells 105 may be referred to as substantially identical memory cells along a row of a memory array, with the term "substantially identical" meaning that the memory cells are identical to one another within reasonable tolerances of fabrication and measurement. For example, memory cell 105(0) may be substantially identical to memory cell 105(2), memory cell 105(1) may be substantially identical to memory cell 105(3), and so on.

The digit lines DL and plate lines PL are shown to be over and supported by a base 410. The base 410 may be a semiconductor material. As shown in FIG. 4C and FIG. 4D, the memory cells 106 each include at least one selection component 424 and a capacitor 405. The selection component 424 may correspond to the selection component T1 of FIG. 4A and FIG. 4B. The capacitor 405 may correspond to the capacitor C1 of FIG. 4A and FIG. 4B. As shown in FIG. 4D, the memory cells 105 may additionally include a second selection component 420. The second selection component 420 may correspond to the selection component T2 of FIG. 4B.

The capacitor 405 may be arranged in a vertical configuration with a first end coupled to the first selection component 424. If present, the second selection component 420 may be coupled to the second end of the capacitor 405. The capacitor 405 includes a first plate, cell top 430, and a second plate, cell bottom 416, and a dielectric material 432 disposed between the cell top 430 and the cell bottom 415.

Although the cell top 430 is shown to be container-shaped and the cell bottom 415 is shown to extend within such container shape, in other embodiments the cell top and bottom may have other configurations. For instance, the cell top and bottom may have planar configurations. Pillar 412 extends from either a plate line PL (memory cells 105(0) and 105(2)) or a digit line DL (memory cells 105(1) and 105(3)) to the cell top 430 of capacitor 405. Pillar 402 extends from either a digit line DL (memory cells 105(0) and 105(2)) or a plate line PL (memory cells 106(1) and 105(3)) to the cell bottom 415 of capacitor 405.

The selection component 424 has source/drain region 414 extending to the cell top 430 of capacitor 405, and has source/drain region 416 extending to the plate line PL. The selection component 424 also has channel region 418 between the source/drain regions 414 and 416. Gate 411 is along the channel region 418 and offset from the channel legions by gate dielectric material 413. The gate 411 may be included in a word line WL.

If present, the selection component 420 has source/drain region 444 extending to the cell bottom 415 of capacitor 405, and has source/drain region 406 extending to the digit line DL. The selection component 420 also has channel region 408 between the source/drain regions 444 and 406. Gate 401 is along the channel region 408 and offset from the channel regions by gate dielectric material 403. The gate 401 may be included in a word line WL.

As shown in the embodiments of FIG. 4C and FIG. 4D, the selection components 420 and 424 and capacitor 405 of the memory cell 105 are vertically stacked, which may enable memory cells 105 to be packed to high levels of integration.

FIG. 4C and FIG. 4D are provided herein as example cross section diagrams for the circuit implementations of FIG. 4A and FIG. 4B. The following the discussion includes additional circuit implementations in accordance with the present disclosure. For the sake of brevity, additional diagrams are omitted from the discussion of further circuit implementations. However, it should be appreciated that the additional circuit implementations may be embodied in circuits similar to those illustrated in the FIG. 4A and FIG. 4B.

Figure 5:
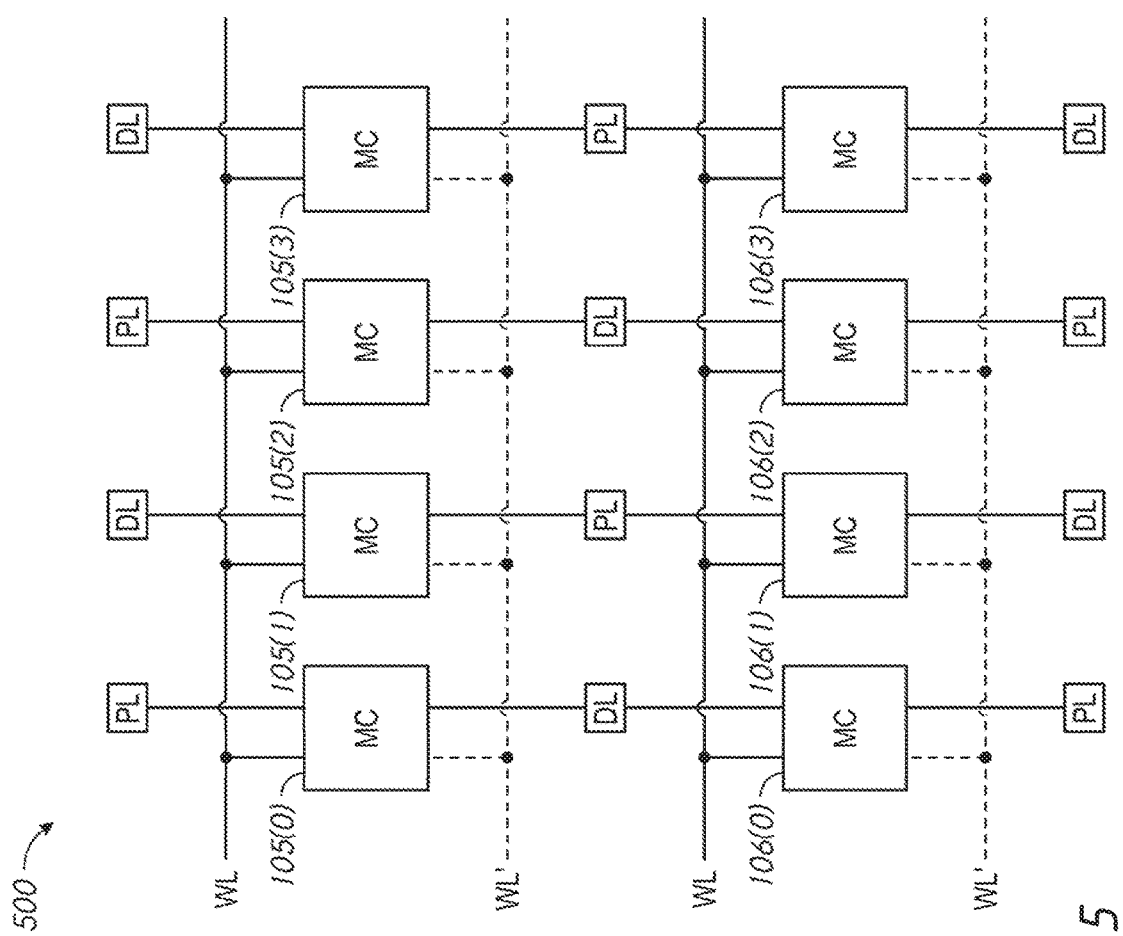
FIG. 5 is a schematic diagram of a general circuit configuration for an example circuit that includes a stacked configuration of two rows of memory cells according to an embodiment of the disclosure.

FIG. 5 is a schematic diagram of a general circuit configuration for an example circuit 500 that includes a stacked configuration of two rows of memory cells according to an embodiment of the disclosure. The example circuit 500 of FIG. 5 includes single-ended memory cells. Here, the example circuit 500 stores a single logical value as a single voltage stored in one memory cell. The first row includes memory cells 105 and the second row includes memory cells 106. The memory cells 105, 106 are each be coupled to at least one word line WL that may be coupled to and may control selection components associated with memory cells 105, 106. By way of example and not limitation, FIG. 5 illustrates a portion of a first row of memory cells that includes four memory cells 105(0) through 105(3) and a portion of a second row of memory cells that includes four memory cells 106(0) through 106(3).

In some embodiments, the memory cells 105, 106 may be also be coupled to a second word line W' that may be coupled to and may control selection components associated with memory cells 105, 106. The selection components may be transistors and the word line(s) may be coupled to the gates of the transistor(s). In some embodiments, memory cell 105, 106 may, include one transistor that is coupled to one word line L. In other embodiments, a memory cell 105, 106 may include a first transistor coupled to a first word line WL and a second transistor coupled to a second transistor WL'.

Each memory cell 105 of the first row may be coupled to one digit line DL. Similarly, each memory cell 106 of the second row may be coupled to one digit line DL. Although not specifically illustrated in FIG. 5, a particular memory cell 105, 106 may be a member of a column of memory cells 105, 106 where each member of the column is coupled to the same digit line DL. Each memory cell 105, 106 may be additionally coupled to a plate line PL that is used during access of the memory cell 105, 106. Although not specifically illustrated in FIG. 5, a particular memory cell 105, 106 may be a member of a column of memory cells 105, 106 where each member of the column is coupled to the same plate line PL.

In the example circuit 500 of FIG. 5, some plate lines PL and some digit lines DL may be shared between two adjacent memory cells. For example, memory cell 105(0) and memory cell 106(0) share a digit line DL. Here, the shared digit line may include a switch that routes the digit line to an appropriate sense amplifier given which memory cell 105(0) or 106(0) is being accessed. By way of further example, memory cell 105(1) and memory cell 106(1) share a plate line PL. Here a switch associated with the shared plate line PL may be omitted as the shared plate line PL provides a constant voltage that may be the same when either memory cell 105(1) or 106(1) is accessed.

The example circuit 500 of FIG. 5 includes an alternating pattern of plate lines PL and digit line DL in accordance with embodiments of the present disclosure. More specifically, the plate lines PL and digit line DL of circuit 500 are arranged such that a given digit line DL is adjacent to a plate line PL and not another digit line DL. For example, the shared digit line DL associated with the third memory cells 105(2) and 106(2) is adjacent to two plate lines PL and not, adjacent to any other digit lines. The shared plate line PL associated with the second memory cells 105(1) and 106(1) is located to the left of the shared digit line DL associated with the third memory cells 105(2) and 106(2). The shared plate line PL associated with the fourth memory cells 105(3) and 106(3) is located to the right of the shared digit line DL associated with the third memory cells 105(2) and 106(2). By alternating plate lines with digit lines, example circuit 500 of FIG. 5 (and those of FIGS. 6A-C) route lines having more or less constant voltages (the plate lines) adjacent or otherwise nearby to lines carry data (the digit lines) that may be susceptible to fringing effects. The constant voltages of the plate lines provides shielding to the digit lines that reduces or avoids the undesirable fringing effects.

Figure 6A:
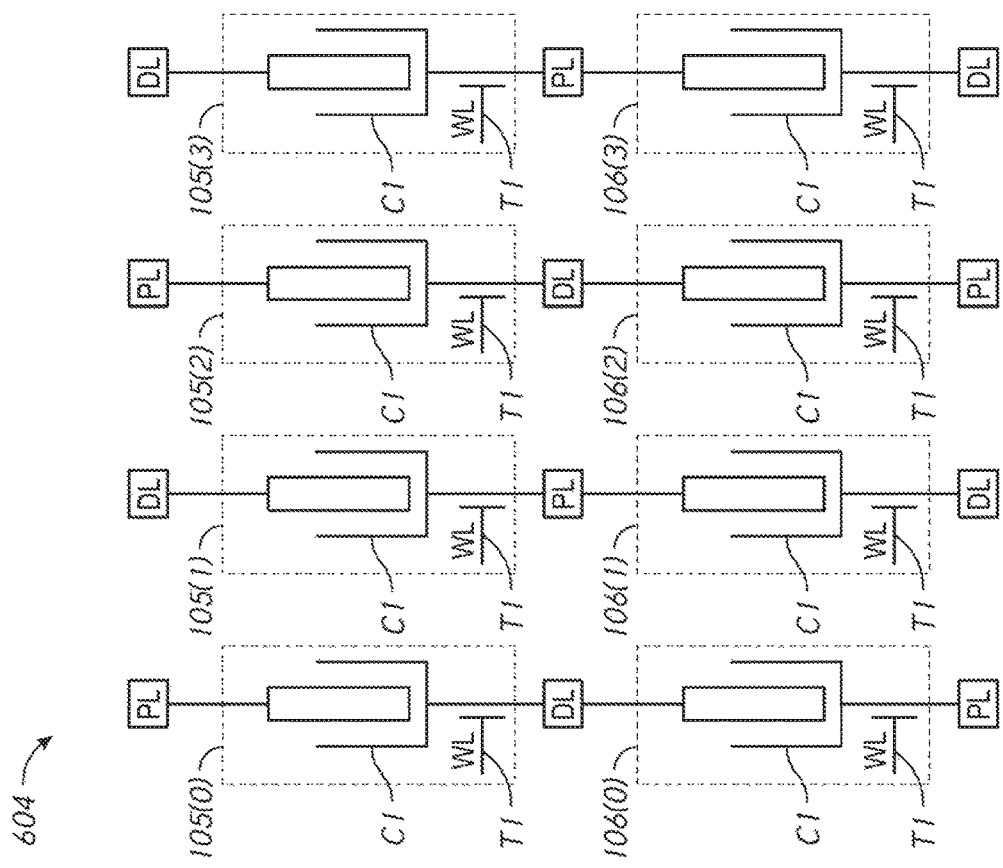
FIGS. 6A-C are illustrations of more specific circuit implementations of the general circuit configuration of FIG. 5.
Figure 6B:
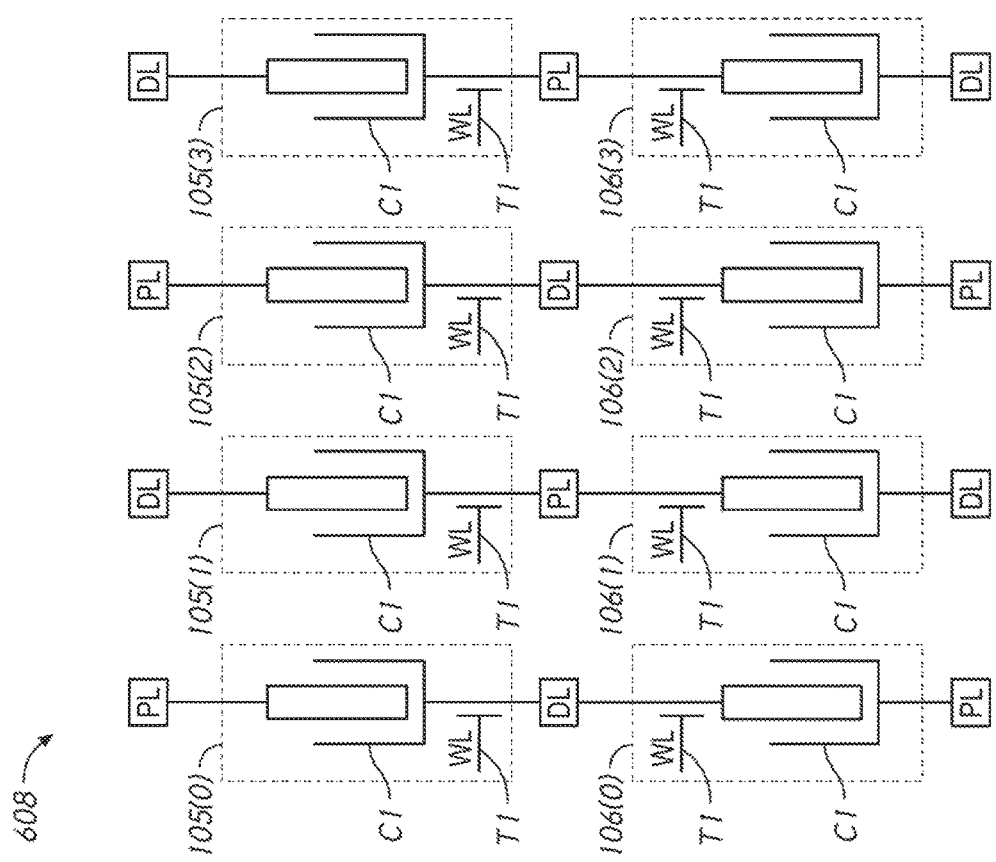
Figure 6C:
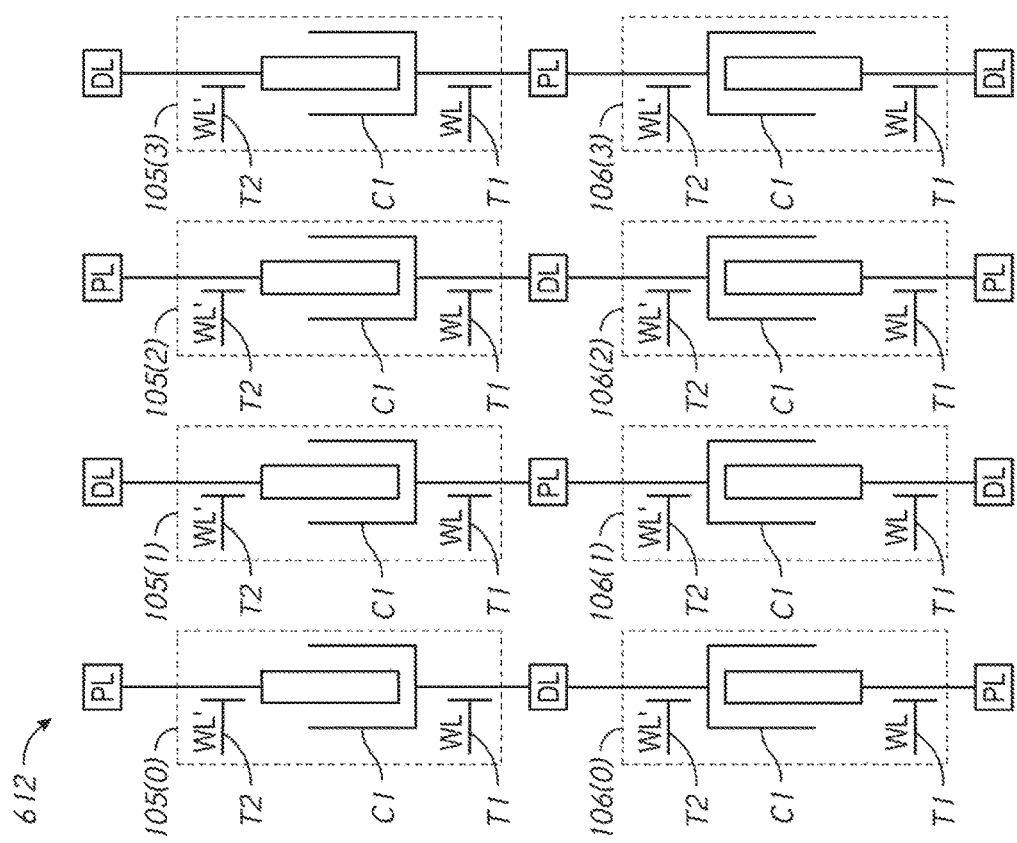

FIGS. 6A-C are illustrations are of more specific circuit implementations of the general circuit configuration 500 of FIG. 5. A dashed line demarcates an approximate boundary of the memory cells 105, 106. In the implementations of FIGS. 6A-B, each of the memory cells 105, 106 includes one selection component T1 and one capacitor C1 1T1C), in the implementation of FIG. 6C, each of the memory cells 105, 106 includes two selection components T1 and T2 and one capacitor C1 (e.g., 2T1C). The capacitors C1 of each memory cell 105, 106 may be ferroelectric capacitors or dielectric capacitors, depending on the implementation. The selection components T1 of a memory cell 105, 106 may be transistors, for example, n-type field effect transistors. If present, the selection components T2 of a memory cell 105, 106 may be transistors, for example, p-type field effect transistors.

Operation of the selection component T1 (or selection components T1 and T2) is controlled by applying voltages to the transistor gates. A respective word line may activate the selection components. Word lines WL may activate the selection components T1 of memory cells 105, 106. If present, word lines WL' may activate the selection components T2 of memory cell 105, 106.

The capacitor C1 has a first plate and a second plate. The first and second plates of the capacitors C1 for each memory cell 105, 106 may be coupled to plate lines PL and digit lines DL in an alternating fashion. Configuration and operation of the capacitors C1 for the first memory cells 105(0), 106(0) and second memory cells 105(1), 106(1) are described below by way of example and not limitation.

In the first memory cell 105(0) of the first row, the first plate of capacitor C1 is coupled to a plate line PL. Additionally, the second plate of the capacitor C1 is coupled to a shared digit line DL through the T1 selection component. If the word line WL' is present, the first plate of the capacitor C1 is coupled to the plate line PL through the T2 selection component. If not, the first plate of the capacitor C1 may be directly coupled to the plate line PL.

In the second memory cell 105(1) of the first row, the first plate of capacitor C1 is coupled to a digit line DL. Additionally, the second plate of capacitor C1 is coupled to a shared plate line PL through the T1 selection component. If the word line WL' is present, the first plate of the capacitor C1 is coupled to the digit line DL through the T2 selection component. If not, the first plate of the capacitor C1 may be directly coupled to the digit line DL.

In the first memory cell 106(0) of the second row, the first plate of capacitor C1 is coupled to a shared digit line DL. Additionally, the second plate of the capacitor C1 is coupled to a plate line PL through the T1 selection component. If the word line WL' is present, the first plate of the capacitor C1 is coupled to the shared digit line DL through the T2 selection component. If not, the first plate of the capacitor C1 may be directly coupled to the digit line DL. In an alternative embodiment (FIG. 6B), the first plate of the capacitor C1 is coupled to a shared digit line DL through the T1 selection component and the second plate of the capacitor C1 is directly coupled to a plate line PL.

In the second memory cell 106(1) of the second row, the first plate of capacitor C1 is coupled to a shared plate line PL. Additionally, the second plate of capacitor C1 is coupled to a digit line DL through the T1 selection component. If the word line WL' is present, the first plate of the capacitor C1 is coupled to the shared plate line PL through the T2 selection component. If not, the first plate of the capacitor C1 may be directly coupled to the shared plate line PL. In an alternative embodiment (FIG. 6B), the first plate of the capacitor C1 is coupled to a shared plate line PL through the T1 selection component and the second plate of the capacitor C1 is directly coupled to a digit line DL.

When the first memory cell 105(0) of the first row is activated, such as by word line WL (or by WL and WL'), the second plate of capacitor C1 is coupled to a digit line DL. When the second memory cell 105(1) of the first row is activated, such as by word line WL (or by WL and WL), the first plate of capacitor C1 is coupled to a digit line DL. When the first memory cell 106(0) of the second row is activated, such as by word line WL (or by WL and WL'), the first plate of capacitor C1 is coupled to a digit line DL. When second memory cell 105(1) of the first row is activated, such as by word line WL (or by WL and WL'), the second plate of capacitor C1 is coupled to a digit line DL.

As previously discussed, when coupled to a digit line DL, a memory cell 105 may be accessed. For example, a stored state of the memory cells 105 may be read and/or the memory cells 105 may be written to store a new state or the same state. Various voltages, for example, may be applied to the plates of the capacitor C1 over the digit lines DL and the plate line PL to access (e.g., read and/or write) the memory cells 105. In DRAM embodiments, the plate line PL may be tied to a constant voltage. In NVRAM embodiments, the plate line PL may be coupled to a voltage driver that drives the plate line PL with different voltages. The plate line PL may be driven with different voltages during different phases of an NVRAM write operation.

The memory configurations described above in connection with FIG. 3 through FIG. 6C generally support singled ended memory cell arrangements, at least within a single column of memory cells. In accordance with embodiments of the present disclosure, a differential memory cell configuration may be implemented using one or more of the memory cell arrangements of FIG. 3 through FIG. 6C. As shown in FIG. 7, a memory may organized into two "MATs" that each provide a digit line DL signal to a sense amplifier 712. More specifically, a first MAT 704 provides a first digit line DL 1 signal to the sense amplifier 712. A second MAT 708 provides a second digit line DL 2 signal to the sense amplifiers. The first and second MATs 704 and 708 may be include any of the memory architectures described above in connection with FIG. 3 through FIG. 6C. The digit lines D1 and D2 may carry complementary voltages that together represent a stored logical value. The voltages provided by the digit lines D1 and D2 may correspond to voltages stored in memory cells associated with the first and second MATs 704 and 708, respectively. Thus, as can be seen in FIG. 7, complementary voltages that together provide a differential signal need not be stored in adjacent memory cells. Rather, it is possible to store complementary voltages in a distributed fashion where the two voltages are stored in different areas of a memory.

Figure 8:
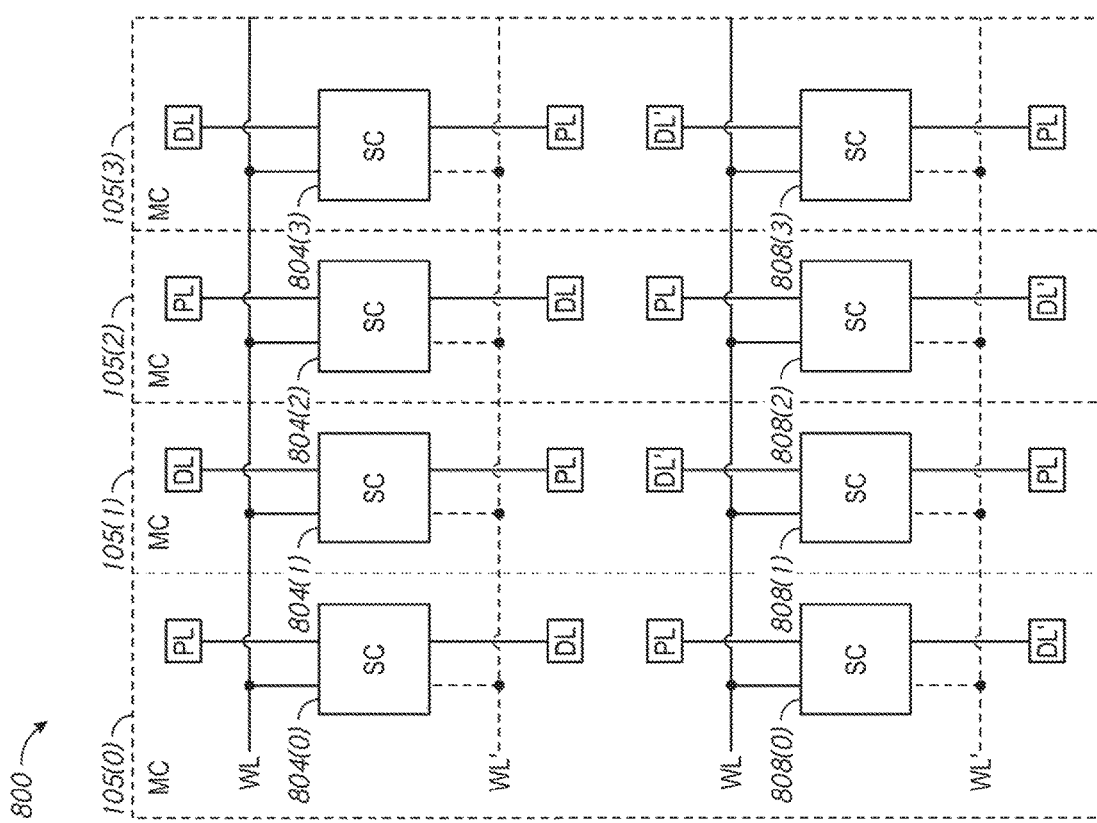
FIG. 8 is a schematic diagram of a general circuit configuration for an example circuit that includes a stacked configuration of two rows of cells according to an embodiment of the disclosure.

FIG. 8 is a schematic diagram of a general circuit configuration for an example circuit 800 that includes a stacked configuration of two rows of cells according to an embodiment of the disclosure. The example circuit 800 of FIG. 8 may be used to implement a fully differential memory cell configuration. Here, a differential memory cell ("MC") of the example circuit 800 stores a single logical value as two complementary voltages that are stored in two different storage cells ("SC"). The first row includes first storage cells 804 and the second row includes second storage cells 808. Storage cells 804 of the first row may be used to store the first complementary logical value for a given memory cell 105. Storage cells 808 of the second may be used to store the second complementary logical value for a given memory cell 105. Thus, a given memory cell 105 may include a first storage cell 804 from the first row and a second storage cell 808 from the second row. The memory cells 105 are each be coupled to at least one word line WL that may be coupled to and may control selection components associated with the individual storage cells 804, 808. By way of example and not limitation, FIG. 8 illustrates a portion of a first row of storage cells that includes four storage cells 804(0) through 804(3) and a portion of a second row of storage cells that includes four storage cells 804(0) through 808(3).

In some embodiments, the memory cells 105 may be also be coupled to a second word line WL' that may be coupled to and may control selection components associated with the individual storage, cells 804, 808. The selection components may be transistors and the word line(s) may be coupled to the gates of the transistor(s). In some embodiments, a storage cell 804, 808 may include one transistor that is coupled to one word line WL. In other embodiments, a storage cell 804, 808 may include a first transistor coupled to a first word line WL and a second transistor coupled to a second transistor WL'.

Each storage cell 105 of the first row may be coupled to one digit line DL. Similarly, each storage cell 106 of the second row may be coupled to one digit line DL'. Together, two corresponding digit lines DL and DL' form the digit lines of a given memory cell 105. Although not specifically illustrated in FIG. 8, a particular storage cell 804, 808 may be a member of a column of storage cells 804, 808 where each member of the column coupled to the same digit line DL, DL'. Each storage cell 804, 808 may be additionally coupled to a plate line PL that is used during access of the storage cell 804, 808. Although not specifically illustrated in FIG. 8, a particular storage cell 804, 808 may be a member column of storage cells 804, 808 where each member of the column is coupled to the same plate line PL.

The example circuit 800 of FIG. 8 includes an alternating pattern of plate lines PL and digit line DL in accordance with embodiments of the present disclosure. More specifically, the plate lines PL and digit line DL of circuit 800 are arranged such that a given digit line DL is adjacent to a plate line PL and not another digit line DL. For example, the digit line DL' associated with the second storage cell 808(1) of the second row is adjacent to three plate lines PL and not adjacent to any other digit lines. The plate line PL associated with the first storage cell 808(0) of the second row is located to the left of the digit line DL' associated with the second storage cell 808(1) of the second row. The plate line PL associated with the third storage cell 808(2) of the second row is located to the right of the digit line DL' associated with the second storage cell 808(1) of the second row. Further, the plate line PL associated with the second storage cell 804(1) of the first row is located above the digit line DL' associated with the second storage cell 808(1) of the second row. By alternating plate lines with digit lines, example circuit 800 of FIG. 8 (and those of FIGS. 9A-C) route lines having more or less constant voltages (the plate lines) adjacent or otherwise nearby to lines carry data (the digit lines) that may be susceptible to fringing effects. The constant voltages of the plate lines provides shielding to the digit lines that reduces or avoids the undesirable fringing effects.

Figure 9A:
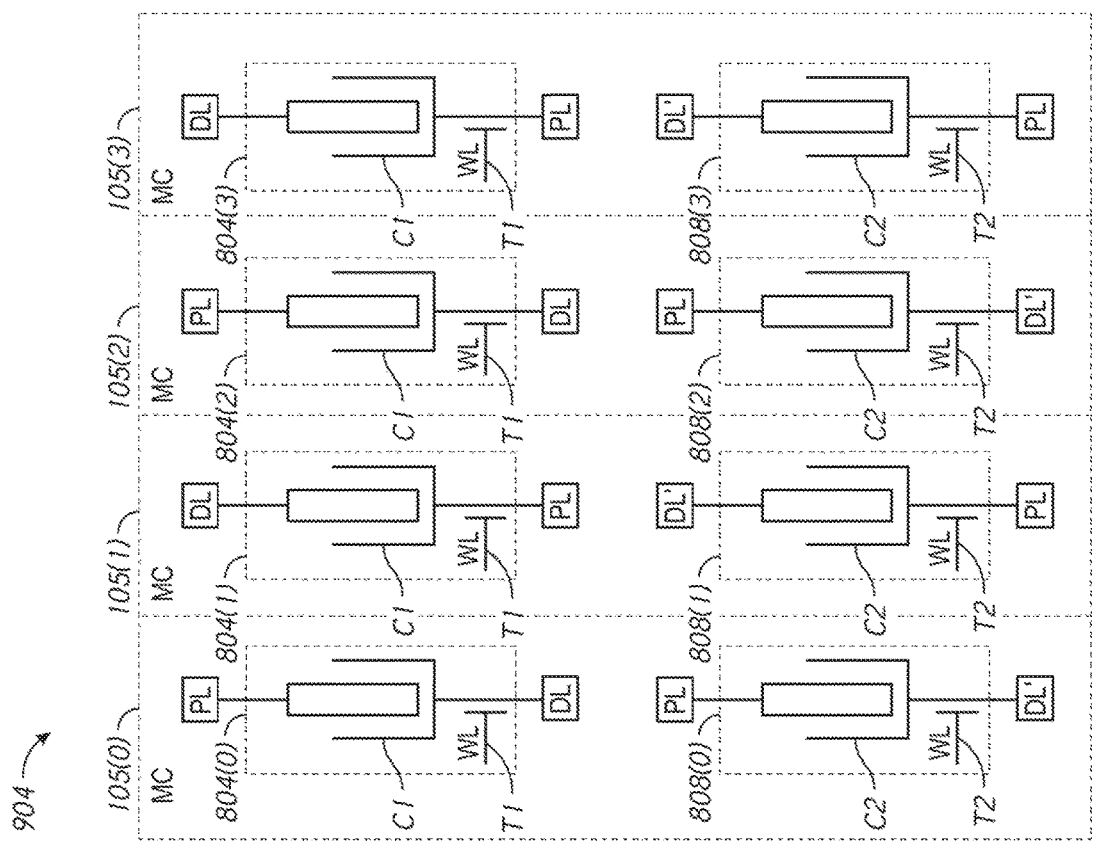
FIGS. 9A-C are illustrations of more specific circuit implementations of the general circuit configuration of FIG. 8.
Figure 9B:
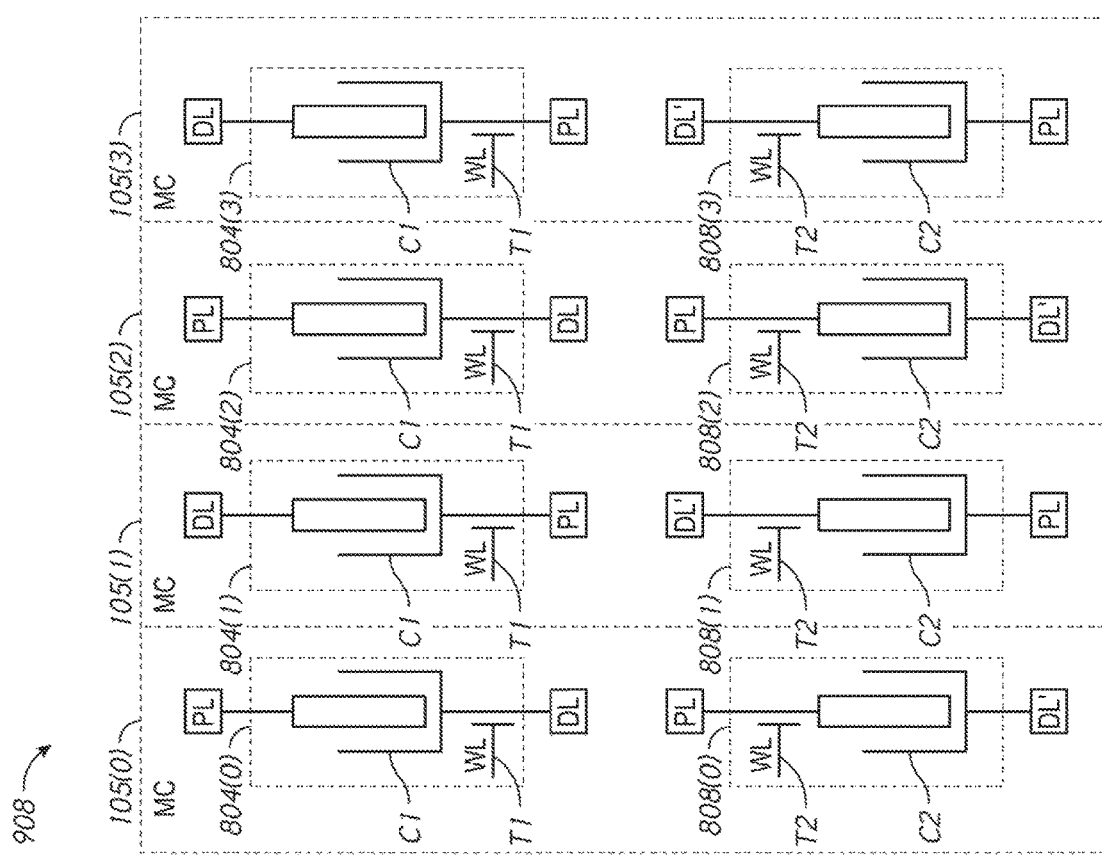
Figure 9C:
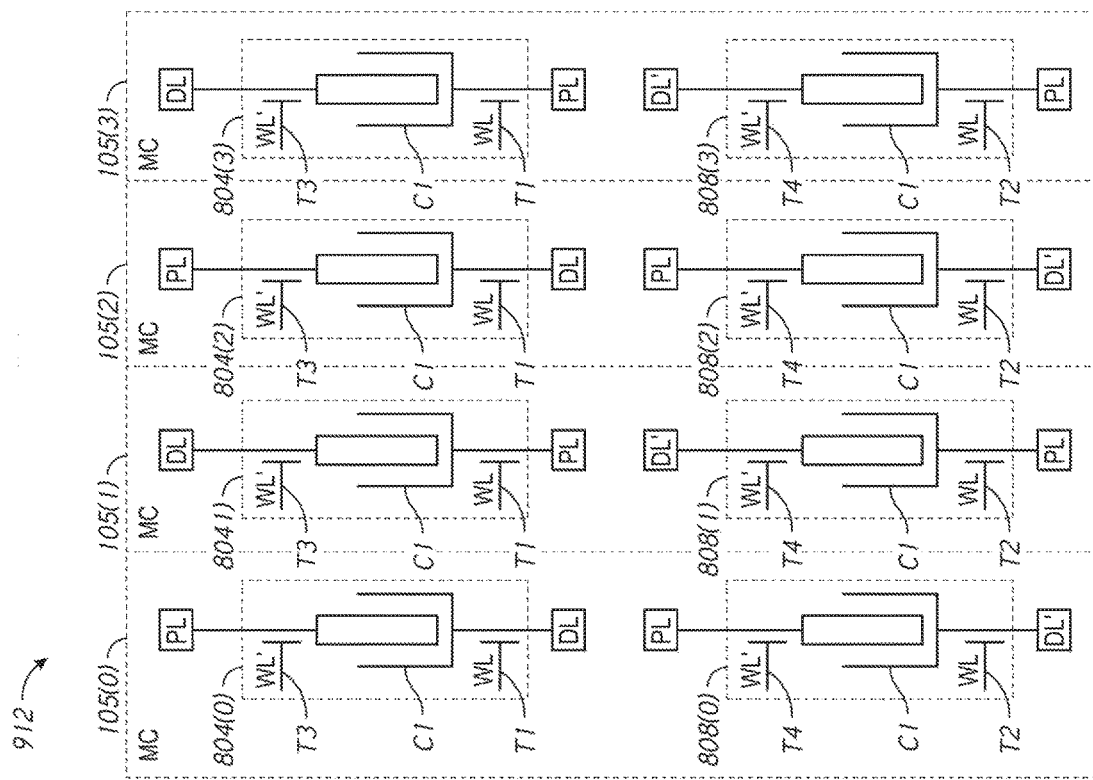

FIGS. 9A-C are illustrations are of more specific circuit implementations of the general circuit configuration 800 of FIG. 8. A dashed line demarcates an approximate boundary of the storage cells 804, 808. An additional dashed line demarcates an approximate boundary of memory cells 105, which include the storage cells 804, 808. In the implementations of FIGS. 6A-B, the storage cells 105 include one selection component T1 and one capacitor C1 and the storage cells 106 include one selection component T2 and one capacitor C2. According, the memory cells 105 include two selection components T1, T2 and two, capacitors C1, C2 (e.g., 2T2C). In the implementations of FIG. 6C, the storage cells 105 include two selection components T3 and one capacitor C1 and the storage cells 106 include two selection components T2, T4 and one capacitor C2 According, the memory cells 105 include four selection components T1, T2, T3, T4 and two capacitors C1, C2 (e.g., 4T2C). The capacitors C1, C2 of each storage cell 804, 808 may be ferroelectric capacitors or dielectric capacitors, depending on the implementation. The selection components T1, T2 of a storage cell 804, 808 may be transistors, for example, n-type field effect transistors. If present, the selection components T3, T4 of a storage cell 804, 808 may be transistors, for example, p-type field effect transistors.

Operation of the selection components T1 and T2 (or selection components T3 and T4) is controlled by applying voltages to the transistor gates. A respective word line may activate the selection components. Word lines WL may activate the selection components T1 and T2 of storage cells 804, 808. If present, word lines WL' may activate the selection components T3 and T4 of storage cells 804, 808.

The capacitors C1 and C2 have first and second plates. The first and second plates of the capacitors C1 for each storage cell 804 may be coupled to plate lines PL and digit lines DL in an alternating fashion. Similarly, the first and second plates of the capacitors C2 for each storage cell 808 may be coupled to plate lines PL and digit lines DL in an alternating fashion Configuration and operation of the capacitors C1 and C2 for the first memory cell 105(0) (including a first and second storage cell 804(0), 808(0)) and the second memory cell 105(1) (including a first and second storage cell 804(1), 808(1)) are described below by way of example and not limitation.

In the first storage cell 804(0) of the first memory cell 105(0), the first plate of capacitor C1 is coupled to a plate line PL. Additionally, the second plate of the capacitor C1 is coupled to a digit line DL through the T1 selection component. If the word line WL' is present, the first plate of the capacitor C1 is coupled to the plate line PL through the T3 selection component. If not, the first plate of the capacitor C1 may be directly coupled to the plate line PL.

In the second storage cell 808(0) of the first memory cell 105(0), the first plate of capacitor C2 is coupled to a plate line PL. Additionally, the second plate of the capacitor C2 is coupled to a digit line DL' through the T2 selection component. If the word line WL' is present, the first plate of the capacitor C2 is coupled to the plate line PL through the T4 selection component. If not, the first plate of the capacitor C2 may be directly coupled to the plate line PL. In an alternative embodiment (FIG. 9B), the first plate of the capacitor C2 is coupled to a plate line PL through the T2 selection component and the second plate of the capacitor C2 is directly coupled to a digit line DL.

In the first storage cell 804(1) of the second memory cell 105(1), the first plate of capacitor C1 is coupled to a digit line D. Additionally, the second plate of capacitor C1 is coupled to a plate line PL through the T1 selection component. If the word line WL' is present, the first plate of the capacitor C1 is coupled to the digit line DL through the T3 selection component. If not, the first plate of the capacitor C1 may be directly coupled to the digit line DL.

In the second storage cell 808(1) of the second memory cell 105(1), the first plate of capacitor C2 is coupled to a digit line DL. Additionally, the second plate of capacitor C2 is coupled to a plate line PL through the T2 selection component. If the word line WL' is present, the first plate of the capacitor C2 is coupled to the digit line DL through the T4 selection component. If not, the first plate of the capacitor C2 may be directly coupled to the digit line DL. In an alternative embodiment (FIG. 9B), the first plate of the capacitor C1 is coupled to a digit line DL through the T2 selection component and the second plate of the capacitor C2 is directly coupled to a plate line PL.

When the first memory cell 105(0) is activated, such as by word line WL (or by WL and WL'), the second plate of capacitor C1 is coupled to a digit line DL and the second plate of capacitor C2 is coupled to a digit line DL'. When the second memory cell 105(0) is activated, such as by word line WL (or by WL and WL'), the first plate of capacitor C1 is coupled to a digit line DL and the first plate of capacitor C2 is coupled to a digit line DL'.

As previously discussed, when coupled to a digit line DL, a memory cell 105 may be accessed. For example, a stored state of the memory cells 105 may be read and/or the memory cells 105 may be written to store a new state or the same state. Various voltages, for example, may be applied to the plates of the capacitor C1 over the digit lines DL and the plate line PL to access (e.g., read and/or write) the memory cells 105. In DRAM embodiments, the plate line PL may be tied to a constant voltage. In NVRAM embodiments, the plate line PL may be coupled to a voltage driver that drives the plate line PL with different voltages. The plate line PL may be driven with different voltages during different phases of an NVRAM write operation.

Various embodiments of memory cells having between one and four transistors and between one and two capacitors have been disclosed with reference to FIGS. 1-9C. The transistors in some embodiments of the memory cells may be vertical transistors each formed from a respective semiconductor pillar. The conductive materials of the first and second plates of the capacitors C1 and C2 may be any suitable conductive materials, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. Some or all of plates of the capacitors C1 and C2 may comprise the same composition as one another, or may comprise different compositions relative to one another.

In the NVRAM memory cells discussed herein, the capacitors C1 and C2 are ferroelectric capacitors. The ferroelectric materials of the capacitors C1 and C2 may comprise any suitable composition or combination of compositions. In some embodiments the capacitor dielectric materials may comprise ferroelectric material. For instance, the capacitor dielectric materials may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element. In some embodiments the ferroelectric materials may comprise a same composition as one another, and in other embodiments may comprise different compositions relative to one another.

The plate line structure PL may comprise any suitable conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc.

The semiconductor pillars may comprise any suitable semiconductor materials including, for example, one or both of silicon and germanium. The source/drain regions, and channel region, may be doped with any suitable dopants. In some embodiments the source/drain regions may be n-type majority doped, and in other embodiments may be p-type majority doped.

The word lines (WL and WL') and digit lines (DL and DL') may comprise any suitable electrically conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. The word lines and digit lines may comprise the same composition as one another, or may comprise different compositions relative to one another.

Insulative material may surround the various components of memory cells disclosed herein. Such insulative material may comprise any suitable composition or combination of compositions; including, for example, one or more of silicon dioxide, silicon nitride, borophosphosilicate glass, spin-on dielectric, etc. Although insulative material may be a single homogeneous material in some embodiments, in other embodiments the insulative material may include two or more discrete insulative compositions.

Figure 10:
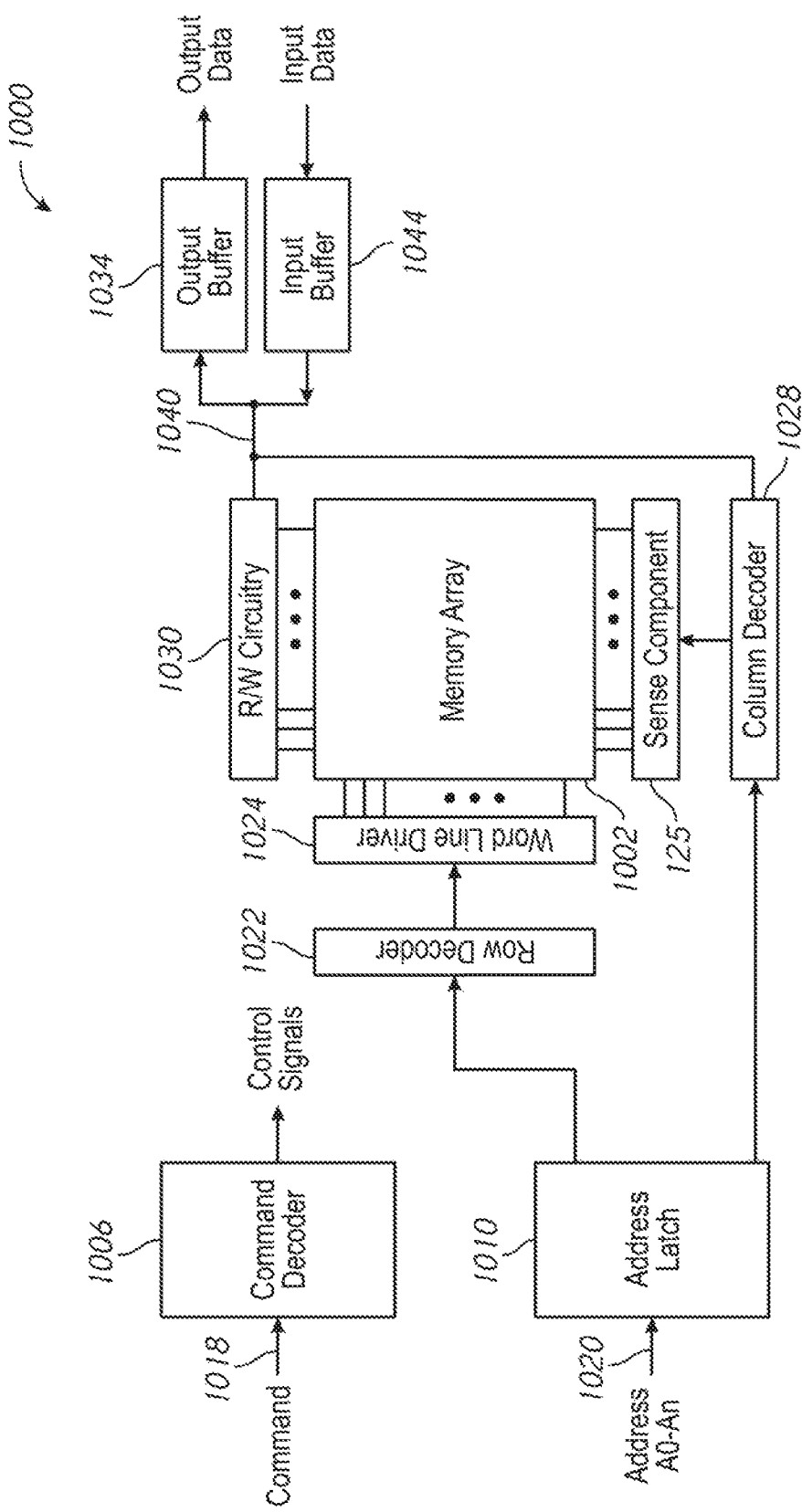
FIG. 10 illustrates a block diagram of a portion of memory that includes memory array that supports a memory in accordance with various embodiments of the present disclosure.

FIG. 10 illustrates a memory 1000 including a memory array 1002 according to an embodiment as discussed herein. The memory 1000 includes an array 1002 of memory cells, which may be, for example, volatile memory cells (e.g., DRAM memory cells, SRAM memory cells), non-volatile memory cells (e.g., flash memory cells or ferromagnetic memory cells), or some other types of memory cells. As described herein, the cell of the memory array 1002 may include digit lines DL and plate lines PL that are arranged in an alternating pattern such that a given digit line DL is adjacent to a plate line PL and not another digit line DL. The memory system additionally includes a sense component 125, to which the digit lines DL may be coupled (FIG. 1).

The memory system 1000 includes a command decoder 1006 that receives memory commands through a command bus 1018 and generates corresponding control signals within the memory system 1000 to carry out various memory operations. The command decoder 1006 responds to memory commands applied to the command bus 1018 to perform various operations on the memory array 1002. For example, the command decoder 1006 is used to generate internal control signals to read data from and write data to the memory array 1002. Row and column address signals are applied to the memory system 1000 through an address bus 1020 and provided to an address latch 1010. The address latch then outputs a separate column address and a separate row address.

The row and column addresses are provided by the address latch 1010 to a row address decoder 1022 and a column address decoder 1028, respectively. The column address decoder 1028 selects bit lines extending through the array 1002 corresponding to respective column addresses. The row address decoder 1022 is connected to word line driver 1024 that activates respective rows of memory cells in the array 1002 corresponding to received row addresses. The selected data line (e.g., a bit line or bit lines) corresponding to a received column address are coupled to a read/write circuitry 1030 to provide read data to a data output buffer 1034 via an input-output data bus 1040. Write data are applied to the memory array 1002 through a data input buffer 1044 and the memory array read/write circuitry 1030.

Figure 11:
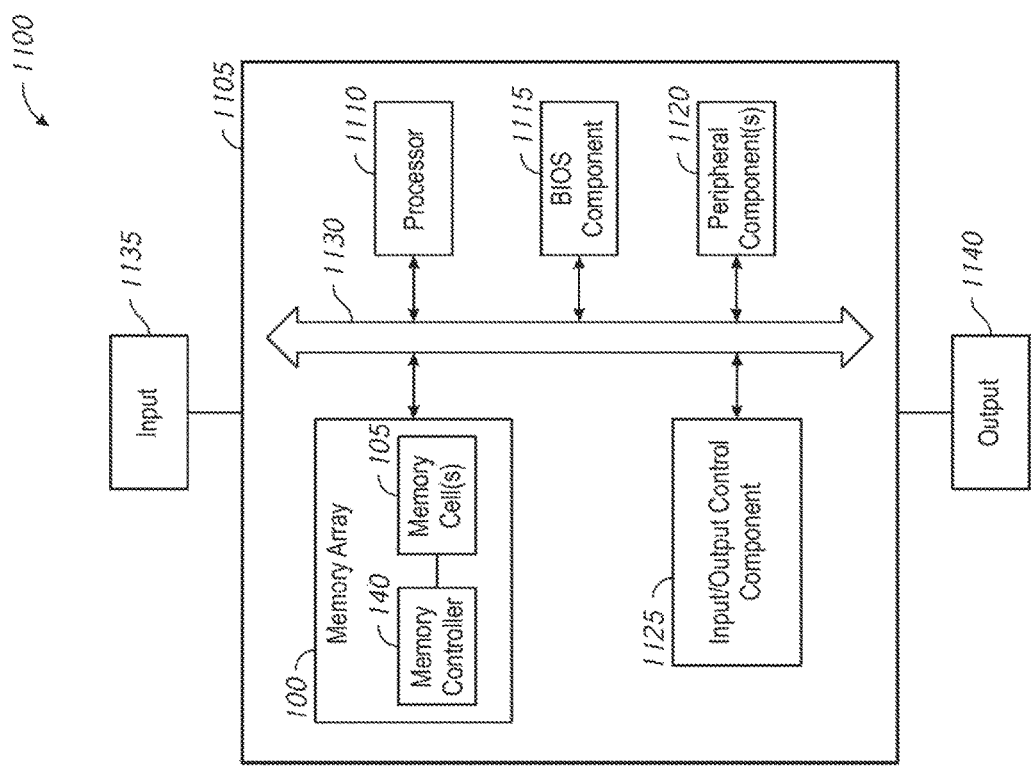
FIG. 11 illustrates a system, that supports a ferroelectric memory in accordance with various embodiments of the present disclosure.

FIG. 11 illustrates a system 1100 that supports a memory in accordance with various embodiments of the present disclosure. System 1100 includes a device 1105, which may be or include a printed circuit board to connect or physically support various components. Device 1105 may be a computer, notebook computer, laptop, tablet computer, mobile phone, or the like. Device 1105 includes a memory array 100, which may be an example of memory array 100 as described with reference to FIGS. 1-10. Memory array 100 may contain memory controller 140 and memory cell(s) 105, which may be examples of memory controller 140 and memory cells 105 described with reference to FIGS. 1-10. Device 1105 may also include a processor 1110, BIOS component 1115, peripheral component(s) 1120, and input/output control component 1125. The components of device 1105 may be in electronic communication with one another through bus 1130.

Processor 1110 may be configured to operate memory array 100 through memory controller 140. In some cases, processor 1110 may perform the functions of memory controller 140 described with reference to FIGS. 1 and 10. In other cases, memory controller 140 may be integrated into processor 1110. Processor 1110 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. The processor 1110 may perform various functions and operate the memory array 100 as described herein. Processor 1110 may, for example, be configured to execute computer-readable instructions stored in memory array 100 to cause device 1105 perform various functions or tasks.

BIOS component 1115 may be a software component that includes a basic input/output system (BIOS) operated as firmware, which may initialize and run various hardware components of system 1100. BIOS component 1115 may also manage data flow between processor 1110 and the various components, e.g., peripheral components 1120, input/output control component 1125, etc. BIOS component 1115 may include a program or software stored in read-only memory (ROM), flash memory, or any other non-volatile memory.

Peripheral component(s) 1120 may be any input or output device, or an interface for such devices, that is integrated into device 1105. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1125 may manage data communication between processor 1410 and peripheral component(s) 1120, input devices 1135, or output devices 1140. Input/output control component 1125 may also manage peripherals not integrated into device 1105. In some cases, input/output control component 1125 may represent a physical connection or port to the external peripheral.

Input 1135 may represent a device or signal external to device 1105 that provides input to device 1105 or its components. This may include a user interface or interface with or between other devices. In some cases, input 1135 may be a peripheral that interfaces with device 1105 via peripheral component(s) 1120 or may be managed by input/output, control component 1125.

Output 1140 may represent a device or signal external to device 1105 configured to receive output from device 1105 or any of its components. Examples of output 1140 may include a display, audio speakers, a printing device, another processor or printed circuit board, etc. In some cases, output 1140 may be a peripheral that interfaces with device 1105 via peripheral component(s) 1120 or may be managed by input/output control component 1125.

The components of memory controller 40, device 1405, and memory array 10 may be made up of circuitry designed to carry out their functions. This may include various circuit elements, for example, conductive lines, transistors, capacitors, inductors, resistors, amplifiers, or other active or inactive elements, configured to carry out the functions described herein.

The above specification, drawings, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

The invention claimed is:

1. An apparatus, comprising:
a first memory cell comprising a storage component having a first end coupled to a plate line and a second end coupled to a digit line; and
a second memory cell comprising a storage component having a first end coupled to a digit line and a second end coupled to a plate line;
wherein the digit line of the second memory cell is adjacent to the plate line of the first memory cell; and
wherein the digit line coupled to the second end of the first memory cell is on an opposite side of the first and second memory cells as the digit line coupled to the first end of the second memory cell.

2. The apparatus of claim 1, wherein the digit line of the first memory cell is adjacent to the plate line of the second memory cell.

3. The apparatus of claim 1, further comprising:
a third memory cell comprising a storage component having a first end coupled to a plate line and a second end coupled to a digit line;
wherein the digit line of the second memory cell is adjacent to the plate line of the third memory cell.

4. The apparatus of claim 3, further comprising:
a first layer of memory cells; and
a second layer of memory cells that includes the first, second, and third memory cells.

5. The apparatus of claim 4, further comprising:
a fourth memory cell included in the first layer of memory cells, the fourth memory cell comprising a storage component having a first end coupled to a plate line and a second end coupled to a digit line;
wherein the digit line of the fourth memory cell and the digit line of the second memory cell are combined into a shared digit line.

6. The apparatus of claim 4, further comprising:
a fourth memory cell included in the first layer of memory cells, the fourth memory cell comprising a storage component having a first end coupled to a digit line and a second end coupled to a plate line;
wherein the digit line of the second memory cell is adjacent to the plate line of the fourth memory cell.

7. The apparatus of claim 1, wherein the first end of the first storage component of the first memory cell is coupled to the plate line through a first selection component.

8. The apparatus of claim 7, wherein the second end of the first storage component of the first memory cell is coupled to the digit line through a second selection component.

9. The apparatus of claim 1, wherein the first and second storage components are dielectric capacitors.

10. The apparatus of claim 1, wherein the first and second storage components are ferroelectric capacitors.

11. An apparatus, comprising:
a first layer of memory cells;
a second layer of memory cells underlying the first layer of memory cells;
a first memory cell included in the first layer of memory cells, the first memory cell comprising a storage component having a first end coupled to a plate line and a second end coupled to a digit line; and
a second memory cell included in the second layer of memory cells, the second memory cell comprising a storage component having a first end coupled to a digit line and a second end coupled to a plate line;
wherein the digit line of the first memory cell and the digit line of the second memory cell are combined between the first and second memory cells into a shared digit line.

12. The apparatus of claim 11, comprising:
a third memory cell included in the first layer of memory cells, the third memory cell comprising a storage component having a first end coupled to a digit line and a second end coupled to a plate line; and
a fourth memory cell included in the second layer of memory cells, the fourth memory cell comprising a storage component having a first end coupled to a plate line and a second end coupled to a digit line; wherein
the plate line of the third memory cell and the plate line of the fourth memory cell are combined into a shared plate line; and
the shared digit line of the first and second memory cell is adjacent to the shared plate line of the third and fourth plate line.

13. The apparatus of claim 12, comprising:
a fifth memory cell included in the first layer of memory cells, the fifth memory cell comprising a storage component having a first end coupled to a digit line and a second end coupled to a plate line; and
a sixth memory cell included in the second layer of memory cells, the sixth memory cell comprising a storage component having a first end coupled to a plate line and a second end coupled to a digit line; wherein
the plate line of the fifth memory cell and the plate line of the sixth memory cell are combined into a shared plate line; and
the shared digit line of the first and second memory cell is adjacent to the shared plate line of the fifth and sixth plate line.

14. The apparatus of claim 11, wherein
a second end of the storage component of the first memory cell is coupled to the digit line through a first selection component; and
a second end of the storage component of the second memory cell is coupled to the plate line through a second selection component.

15. The apparatus of claim 14, wherein
a first end of the storage component of the first memory cell is coupled to the plate line through a third selection component; and
a first end of the storage component of the second memory cell is coupled to the digit line through a fourth selection component.

16. An apparatus, comprising:
a first memory layer;
a second memory layer underlying the first memory layer;
a memory cell including a first storage component in the first memory layer and a second storage component in the second memory layer; wherein
the first storage component includes a first end coupled to a plate line and a second end coupled to a digit line;
the second storage component includes a first end coupled to a plate line and a second end coupled to a digit line; and
the digit line of the first storage component is adjacent to the plate line of the second storage component;
wherein the first and second storage components are aligned along a same axis.

17. The apparatus of claim 16, wherein the memory cell is a first memory cell, the apparatus further comprising:
a second memory cell including a first storage component in the first memory layer and a second storage component in the second memory layer; wherein
the first storage component of the second memory cell includes a first end coupled to a digit line and a second end coupled to a plate line;
the second storage component of the second memory cell includes a first end coupled to a digit line and a second end coupled to a plate line; and
the digit line of the first storage component of the first memory cell is adjacent to the plate line of the first storage component of the second memory cell.

18. The apparatus of claim 17, further comprising:
a third memory cell including a first storage component in the first memory layer and a second storage component in the second memory layer; wherein
the first storage component of the third memory cell includes a first end coupled to a digit line and a second end coupled to a plate line;
the second storage component of the third memory cell includes a first end coupled to a digit line and a second end coupled to a plate line; and
the digit line of the first storage component of the first memory cell is adjacent to the plate line of the first storage component of the third memory cell.

19. The apparatus of claim 16, wherein
a second end of the first storage component is coupled to the digit line through a first selection component; and
a second end of the second component is coupled to the digit line through a second selection component.

20. The apparatus of claim 19, wherein
a first end of the second storage component is coupled to the plate line through a third selection component; and
a first end of the second storage component is coupled to the plate line through a fourth selection component.

* * * * *